(12) United States Patent
Yoshida

(10) Patent No.: US 9,859,056 B2
(45) Date of Patent: Jan. 2, 2018

(54) MULTILAYER CERAMIC CAPACITOR

(71) Applicant: Murata Manufacturing Co., Ltd., Nagaokakyo-shi, Kyoto-fu (JP)

(72) Inventor: Akihiro Yoshida, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 105 days.

(21) Appl. No.: 14/867,282

(22) Filed: Sep. 28, 2015

(65) Prior Publication Data

US 2016/0095223 A1    Mar. 31, 2016

(30) Foreign Application Priority Data

Sep. 30, 2014 (JP) ................................. 2014-202089

(51) Int. Cl.
*H01G 4/30* (2006.01)
*H01G 4/12* (2006.01)
*H01G 4/012* (2006.01)
*H01G 4/232* (2006.01)
(Continued)

(52) U.S. Cl.
CPC .............. *H01G 4/12* (2013.01); *H01G 4/012* (2013.01); *H01G 4/2325* (2013.01); *H01G 4/30* (2013.01); *H05K 1/0271* (2013.01); *H05K 1/181* (2013.01); *H05K 2201/10015* (2013.01)

(58) Field of Classification Search
CPC ........ H01G 2/065; H01G 4/248; H01G 4/005; H01G 4/06; H01G 4/228; H01G 4/232; H01G 4/12; H01G 4/012; H01G 4/30; H01G 4/2325; H01G 4/1227; H05K 1/0231; H05K 1/181; H05K 1/18; H05K 1/0271; H05K 1/185; H05K 1/0298; H05K 1/182; H05K 1/115; H05K 2201/10015; H01C 1/148; H01C 7/18; H01C 7/13; H01C 17/283; H01L 41/0471; H01L 41/047; H01L 41/293; H01L 41/0472; Y10T 29/435; Y10T 29/49147; Y10T 29/43; Y10T 29/4902
USPC ........ 174/260, 565; 361/301.4, 306.3, 321.1, 361/321.3, 321.2, 306.1, 305, 311, 309, 361/303; 310/366; 338/22 R; 29/25.42
See application file for complete search history.

(56) References Cited

U.S. PATENT DOCUMENTS 9,627,136 B2 * 4/2017 Nishisaka ............ H01G 4/2325
2002/0046861 A1 * 4/2002 Yokoyama ............ H01C 1/148
174/565
(Continued)

FOREIGN PATENT DOCUMENTS

JP    2002-203735 A    7/2002

*Primary Examiner* — Timothy Thompson
*Assistant Examiner* — Guillermo Egoavil
(74) *Attorney, Agent, or Firm* — Keating & Bennett, LLP

(57) ABSTRACT

A multilayer ceramic capacitor includes an external electrode on an end surface of a ceramic body to be connected to internal electrodes including a base layer including a sintered metal containing Cu and glass and a Cu plated layer on the base layer. The external electrode includes a principal surface portion disposed on a principal surface of the ceramic body. The Cu metal of the Cu plated layer is present in the base layer to a position of about ⅓ or more of the thickness of the base layer from a surface layer of the external electrode. The metal thickness of the external electrode is about 8.7 μm or more and about 13.9 μm or less.

20 Claims, 12 Drawing Sheets

(51) Int. Cl.
*H05K 1/02* (2006.01)
*H05K 1/18* (2006.01)

(56) References Cited

U.S. PATENT DOCUMENTS

| | | | |
|---|---|---|---|
| 2010/0282500 A1* | 11/2010 | Ryu | C25D 5/12 174/257 |
| 2014/0029157 A1* | 1/2014 | Kwag | H01G 4/30 361/301.4 |
| 2014/0285947 A1* | 9/2014 | Suga | H01G 4/232 361/301.4 |
| 2015/0041196 A1* | 2/2015 | Kim | H01G 4/30 174/260 |
| 2015/0122535 A1* | 5/2015 | Lee | H01G 4/30 174/260 |
| 2016/0042867 A1* | 2/2016 | Kisumi | H01G 4/30 361/301.4 |
| 2016/0093437 A1* | 3/2016 | Itamura | H01G 4/12 361/301.4 |
| 2016/0093438 A1* | 3/2016 | Sasabayashi | H01G 4/12 174/260 |
| 2016/0093440 A1* | 3/2016 | Nishisaka | H01G 4/2325 361/301.4 |
| 2016/0093444 A1* | 3/2016 | Itamura | H01G 4/248 174/260 |
| 2017/0178809 A1* | 6/2017 | Nishisaka | H01G 4/248 |

* cited by examiner

MULTILAYER CERAMIC CAPACITOR

BACKGROUND OF THE INVENTION

1. Field of the Invention

The present invention relates to a multilayer ceramic capacitor.

2. Description of the Related Art

In recent years, with the reduction in size and height for electronic devices such as cellular phones and portable music players, multilayer printed wiring boards mounted on the electronic devices have been progressively reduced in size. Accordingly, multilayer ceramic capacitors mounted on the multilayer printed wiring boards have been also progressively reduced in size and height.

Some of the multilayer ceramic capacitors are built into multilayer printed wiring boards, such as the multilayer ceramic capacitor described in, for example, Japanese Patent Application Laid-Open No. 2002-203735. In the case of building the multilayer ceramic capacitor into Japanese Patent Application Laid-Open No. 2002-203735, there is a need to irradiate external electrodes of the multilayer ceramic capacitor with a laser to form opening for via holes in order to electrically connect the capacitor to the multilayer printed wiring board.

However, the external electrodes preferably have laser resistance in the case of irradiating the external electrodes of the multilayer ceramic capacitor with a laser in order to form the openings for via holes. This is because the external electrodes may be damaged unless the electrodes have laser resistance.

Moreover, if the multilayer ceramic capacitor to be built into a multilayer printed wiring board has large differences in level between the surface of the ceramic body and the surfaces of the external electrodes, the gap between the surface of the multilayer printed wiring board and the mounting surface of the ceramic body is widened when the capacitor is built in the multilayer printed wiring board. Therefore, peeling is likely to be caused between the multilayer printed wiring board and the external electrodes, and there is also a problem of moisture ingress from the peeled sites, which results in degraded resistance to moisture.

SUMMARY OF THE INVENTION

Therefore, preferred embodiments of the present invention provide a multilayer ceramic capacitor with an external electrode that has excellent laser resistance and moisture resistance.

The multilayer ceramic capacitor according to a preferred embodiment of the present invention is a multilayer ceramic capacitor including a ceramic body with a plurality of ceramic layers and internal electrodes stacked, which includes principal surfaces opposed to each other, side surfaces opposed to each other, and end surfaces opposed to each other; and an external electrode including a base layer including a sintered metal containing Cu and glass and a Cu plated layer provided on a surface of the base layer, which is provided on one of the end surfaces of the ceramic body to be connected to the internal electrodes, where the external electrode includes a principal surface portion disposed on one of the principal surfaces of the ceramic body, the Cu metal of the Cu plated layer is present in the base layer to a position of about ⅓ or more of a thickness of the base layer from a surface layer of the external electrode, and the external electrode is about 8.7 µm or more and about 13.9 µm or less in metal thickness.

Furthermore, the multilayer ceramic capacitor is preferably about 0.9 mm or more and about 1.1 mm or less in dimension in a direction of connecting the end surfaces to each other, about 0.4 mm or more and about 0.6 mm or less in dimension in a direction of connecting the side surfaces to each other, and about 0.085 mm or more and about 0.15 mm or less in dimension in a direction of connecting the principal surfaces to each other.

In addition, in a multilayer ceramic capacitor according to a preferred embodiment of the present invention, the Cu plated layer is preferably formed with the use of any of a pyrophosphoric acid Cu plating solution and a cyanide Cu plating solution.

Furthermore, in a multilayer ceramic capacitor according to a preferred embodiment of the present invention, the glass contained in the base layer is preferably composed of glass containing BaO in an amount of about 10 weight % or more and about 50 weight % or less, SrO in an amount of about 10 weight % or more and about 50 weight % or less, $B_2O_3$ in an amount of about 3 weight % or more and about 30 weight % or less, and $SiO_2$ in an amount of about 3 weight % or more and about 30 weight % or less.

When the low-reflectance glass component contained in the base layer is directly irradiated with a laser, the base layer of the sintered metal containing Cu and glass will absorb the energy of the laser to decrease the laser resistance. Accordingly, the Cu plated layer preferably defines an outermost layer of the external electrode. More specifically, the laser resistance of the external electrode is determined by the total amount of Cu contained in the base layer and Cu of the Cu plated layer.

According to a preferred embodiment of the present invention, the glass contained in the base layer is dissolved to cause the Cu metal of the Cu plated layer to penetrate in the base layer to a position of about ⅓ or more of the thickness of the base layer from the surface layer of the external electrode, and the Cu content rate is high in the base layer. Accordingly, in combination with the base layer and Cu plated layer in total, the content rate of Cu per unit thickness is increased to improve the thermal conductivity (heat release performance) of the base layer and increase the laser resistance of the external electrode.

In addition, in a preferred embodiment of the present invention, a difference in level between the surface of the multilayer printed wiring board and the surface of the external electrode is reduced because the external electrode including the base layer and the Cu plated layer is reduced in total thickness (the metal thickness of the external electrode is about 8.7 µm or more and about 13.9 µm or less). As a result, the gap between the surface of the multilayer printed wiring board and the mounting surface of the ceramic body is narrowed to make peeling less likely to be caused between the multilayer printed wiring board and the external electrode and also improve the mechanical strength of the component. It is to be noted that the metal thickness refers to a value obtained by measuring the thickness of the metal with a fluorescent X-ray film thickness meter, and converting the measured X-ray Cu amount into a film thickness.

Furthermore, in a preferred embodiment of the present invention, when a pyrophosphoric acid Cu plating solution or a cyanide Cu plating solution is used as the plating solution for forming the Cu plated layer, the plating solution with high glass erosion capability, efficiently dissolves the glass contained in the base layer, and easily cause the Cu metal of the Cu plated layer to penetrate into the base layer, thus improving the content rate of Cu in the base layer.

Furthermore, in a preferred embodiment of the present invention, when the glass contained in the base layer includes glass containing BaO in an amount of about 10 weight % or more and about 50 weight % or less, SrO in an amount of about 10 weight % or more and about 50 weight % or less, $B_2O_3$ in an amount of about 3 weight % or more and about 30 weight % or less, and $SiO_2$ in an amount of about 3 weight % or more and about 30 weight % or less, the glass contained in the base layer is dissolved reliably.

According to a preferred embodiment of the present invention, the Cu metal of the Cu plated layer penetrates in the base layer to a position of about 1/3 or more of the base electrode thickness from the surface layer of the external electrode. Thus, the Cu content rate in the base layer is increased, and the thermal conductivity (heat release performance) of the base layer is improved to increase the laser resistance of the external electrode. In addition, the difference in level between the surface of the multilayer printed wiring board and the surface of the external electrode is reduced because the external electrode including the base layer and the Cu plated layer is reduced in total thickness (for example, the metal thickness of the external electrode on average preferably is about 8.7 μm or more and about 13.9 μm or less). As a result, the narrowed gap between the surface of the multilayer printed wiring board and the mounting surface of the ceramic body significantly reduces or prevents peeling between the multilayer printed wiring board and the external electrode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
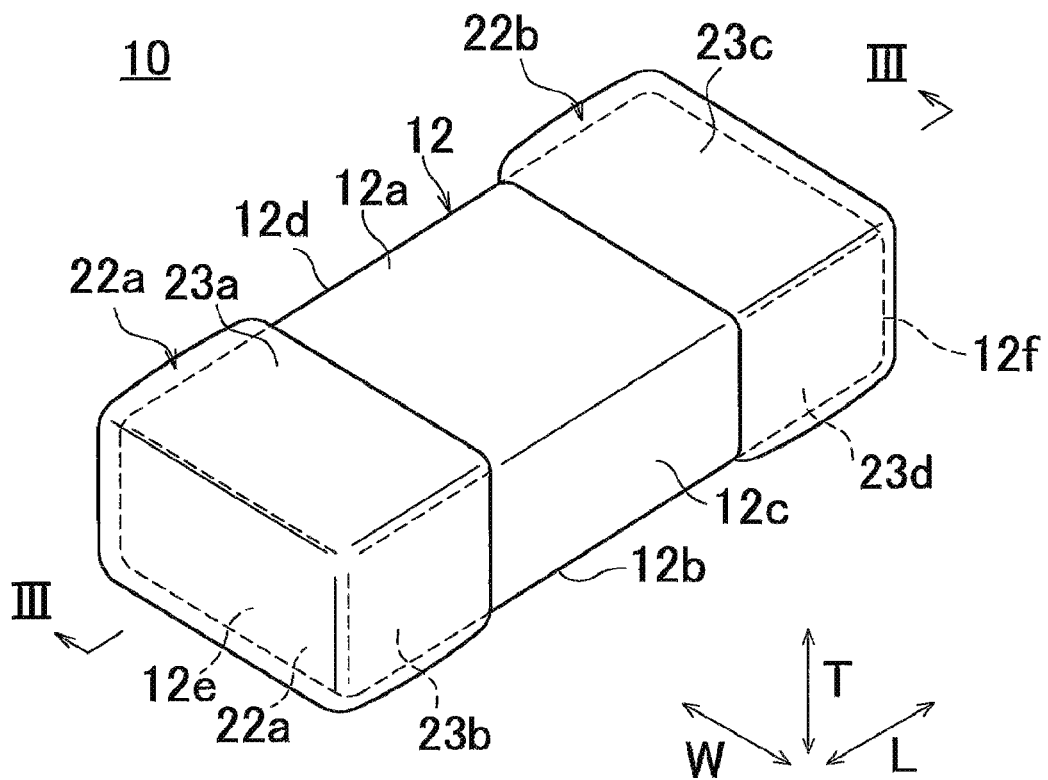
FIG. 1 is a perspective view illustrating an example of a multilayer ceramic capacitor according to a preferred embodiment of the present invention.
Figure 2:
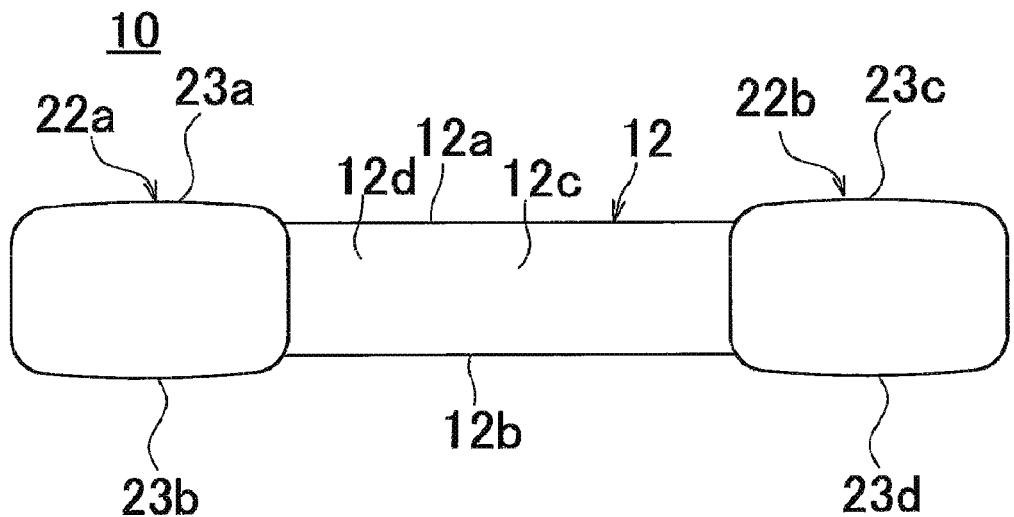
FIG. 2 is a side view of the multilayer ceramic capacitor shown in FIG. 1.
Figure 3:
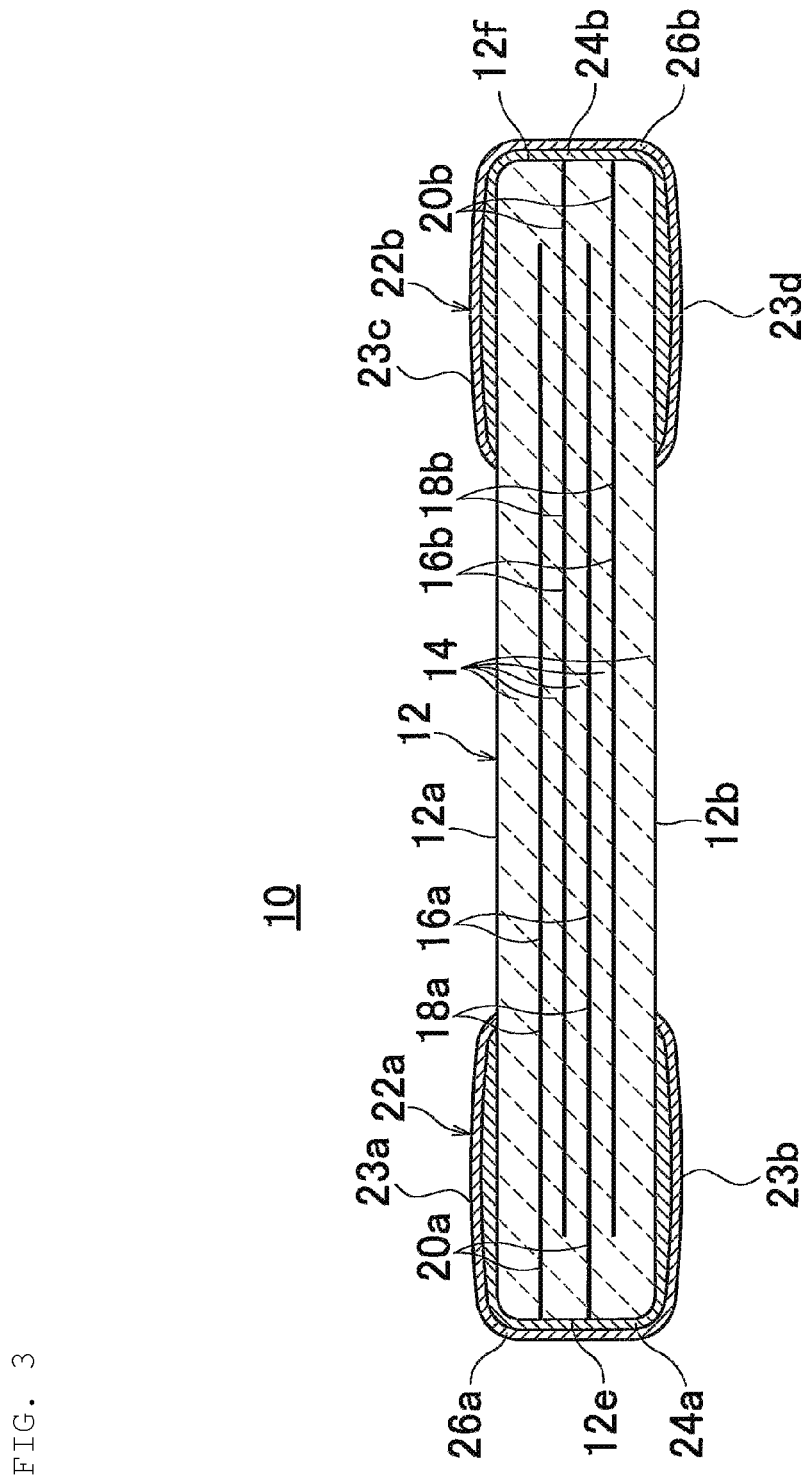
FIG. 3 is a cross-sectional view along line III-III of FIG. 1.

FIG. 1 is an external perspective view illustrating a multilayer ceramic capacitor 10. FIG. 2 is a side view of the multilayer ceramic capacitor 10 shown in FIG. 1. FIG. 3 is a cross-sectional view along line III-III of FIG. 1.

The multilayer ceramic capacitor 10 shown in FIG. 1 includes a ceramic body 12, for example, in the form of a cuboid. This multilayer ceramic capacitor 10 is mostly a multilayer ceramic capacitor built in a multilayer printed wiring board. The ceramic body 12 includes a plurality of ceramic layers 14 stacked. The ceramic body 12 includes a pair of principal surfaces 12a, 12b opposed to each other, a pair of side surfaces 12c, 12d opposed to each other, and a pair of end surfaces 12e, 12f opposed to each other.

The principal surfaces 12a, 12b are each arranged in a length direction L and a width direction W.

The side surfaces 12c, 12d are each arranged in the length direction L and a height direction T.

The end surfaces 12e, 12f are each arranged in the width direction W and the height direction T.

Therefore, the length direction L refers to a direction of connecting the pair of end surfaces 12e, 12f to each other, the width direction W refers to a direction of connecting the pair of side surfaces 12c, 12d to each other, and the height direction T refers to a direction of connecting the pair of principal surfaces 12a, 12b to each other.

It is to be noted that while the multilayer ceramic capacitor 10 according to this preferred embodiment preferably has a cuboid shape, the shape of the ceramic body 12 is not particularly limited.

In addition, the ceramic body 12 preferably has corners and ridges rounded.

The ceramic layers 14 of the ceramic body 12 can be formed from a dielectric ceramic material. As the dielectric ceramic material for the ceramic layers 14, a dielectric ceramic can be used which contains a main constituent such as, for example, $BaTiO_3$, $CaTiO_3$, $SrTiO_3$, and $CaZrO_3$. Furthermore, depending on desired characteristics of the multilayer ceramic capacitor 10, the main constituents may be used to which accessory constituents are added such as Mn compounds, Mg compounds, Si compounds, Fe compounds, Cr compounds, Co compounds, Ni compounds, rare-earth compounds.

Furthermore, the ceramic layers 14 are preferably about 0.5 µm or more and about 10 µm or less in height.

In this preferred embodiment, for each effective portion of the ceramic body 12, opposed portions 18a, 18b of internal electrodes 16a, 16b to be described are opposed with the ceramic layers 14 of the dielectric ceramic interposed therebetween to generate electrostatic capacitance. Thus, this preferred embodiment defines and functions as a capacitor.

Within the ceramic body 12, a plurality of substantially rectangular first internal electrodes 16a and second internal electrodes 16b are alternately arranged at regular intervals in the height direction T of the ceramic body 12.

The first internal electrodes 16a include the opposed portions 18a and extended portions 20a. The opposed portions 18a are opposed to the second internal electrodes 16b. The extended portions 20a are exposed by extending from the opposed portions 18a to the end surface 12e of the ceramic body 12, but not exposed at the end surface 12f or the side surfaces 12c, 12d.

The second internal electrodes 16b include the opposed portions 18b and extended portions 20b as in the case of the first internal electrodes 16a. The opposed portions 18b are opposed to the first internal electrodes 16a. The extended portions 20b are extended from the opposed portions 18b to the end surface 12f of the ceramic body 12, but not exposed at the end surface 12e or the side surfaces 12c, 12d.

Furthermore, the first internal electrodes 16a and the second internal electrodes 16b are each parallel or substantially parallel to the principal surface 12a and principal surface 12b of the ceramic body 12. In addition, the first internal electrodes 16a and the second internal electrodes 16b are opposed to each other with the ceramic layers 14 interposed therebetween in the height direction T of the ceramic body 12.

The internal electrodes 16a, 16b are each, for example, about 0.2 µm or more and about 2 µm or less in height. The internal electrodes 16a, 16b can be composed of an appropriate conductive material. The internal electrodes 16a, 16b can be composed of, for example, a metal such as Ni, Cu, Ag, Pd, and Au, or an alloy containing one of the metals, such as, for example, an Ag—Pd alloy.

In this regard, the respective metals of the first internal electrodes 16a and second internal electrodes 16b are preferably diffused in a first external electrode 22a and a second external electrode 22b as described later. The metal of the first internal electrode 16a diffuses into the first external electrode 22a to expand the volume of the metal in the first external electrode 22a and fill minute gaps in the first external electrode 22a, thus making it possible improve the sealing property against ingress of moisture. Likewise, the metal of the second internal electrode 16b diffuses into the second external electrode 22b to expand the volume of the metal in the second external electrode 22b and fill minute gaps in the second external electrode 22b, thus making it possible improve the sealing property against ingress of moisture. It is to be noted that the diffusion distances of the metals of the internal electrodes 16a, 16b into the external electrodes 22a, 22b are preferably about 4 µm or more.

In addition, glass layers may be formed on exposed portions where the extended portions 20a, 20b of the internal electrodes 16a, 16b are exposed at the end surfaces 12e, 12f of the ceramic body 12. The formation of the glass layers on the exposed portions of the internal electrodes 16a, 16b ensure moisture resistance and plating resistance, and suppress or prevent ingress of moisture from the outside, even when the external electrodes 22a, 22b to be described are insufficiently dense. As a result, the moisture resistance and plating resistance of the multilayer ceramic capacitor 10 are improved.

The first external electrode 22a and the second external electrode 22b are respectively provided on the end surfaces 12e, 12f of the ceramic body 12. The first external electrode 22a is electrically connected through the extended portions 20a to the first internal electrodes 16a at the end surface 12e. In addition, the first external electrode 22a is provided on the principal surfaces so as to partially cover the principal surfaces 12a, 12b and the side surfaces 12c, 12d from the surface of the end surface 12e. The second external electrode 22b is electrically connected through the extended portions 20b to the second internal electrodes 16b at the end surface 12f. In addition, the second external electrode 22b is provided on the principal surfaces so as to partially cover the principal surfaces 12a, 12b and the side surfaces 12c, 12d from the surface of the end surface 12f.

The first external electrode 22a includes a base layer 24a and a plated layer 26a provided on the surface of the base layer 24a. Furthermore, the second external electrode 22b includes a base layer 24b and a plated layer 26b provided on the surface of the base layer 24b.

The base layers 24a, 24b include a sintered metal containing Cu and glass. The base layers 24a, 24b may be co-fired by co-firing with the internal electrodes 16a, 16b, or post-fired by baking a conductive paste applied. The base layers 24a, 24b are preferably about 1 µm or more and about 20 µm or less in thickness.

The plated layers 26a, 26b may include a plurality of layers formed. The material constituting the outermost plated layers 26a, 26b includes a Cu plated film. The plated layers 26a, 26b are preferably about 1 µm or more and about 10 µm or less in thickness. When the outermost layers include a Cu plated film, it becomes possible to use the multilayer ceramic capacitor 10 as an electronic component built in a multilayer printed wiring board.

More specifically, in the case of embedding the multilayer ceramic capacitor 10 into a multilayer printed wiring board, there is a need to provide via holes for electronic component connection in the multilayer printed wiring board, in order to provide electrical connection to the external electrode 22a, 22b. The via holes for electronic component connection are formed with the use of a laser such as a $CO_2$ laser, for example. In the case of forming the via holes with the use of a laser, the first external electrodes 22a, 22b of the multilayer ceramic capacitor 10 are directly irradiated with the laser. In this regard, when the outermost layers of the plated layers 26a, 26b of the external electrodes 22a, 22b include a Cu plated film, the laser is reflected at a high reflectance, and the capacitor is thus about to be used in a preferred manner as the multilayer ceramic capacitor 10 to be embedded in the multilayer printed wiring board. This is because when the laser reflectance is low with respect to the external electrodes 22a, 22b of the multilayer ceramic capacitor 10, the laser may reach even the inside of the multilayer ceramic capacitor 10, and damage the multilayer ceramic capacitor 10.

Figure 4:
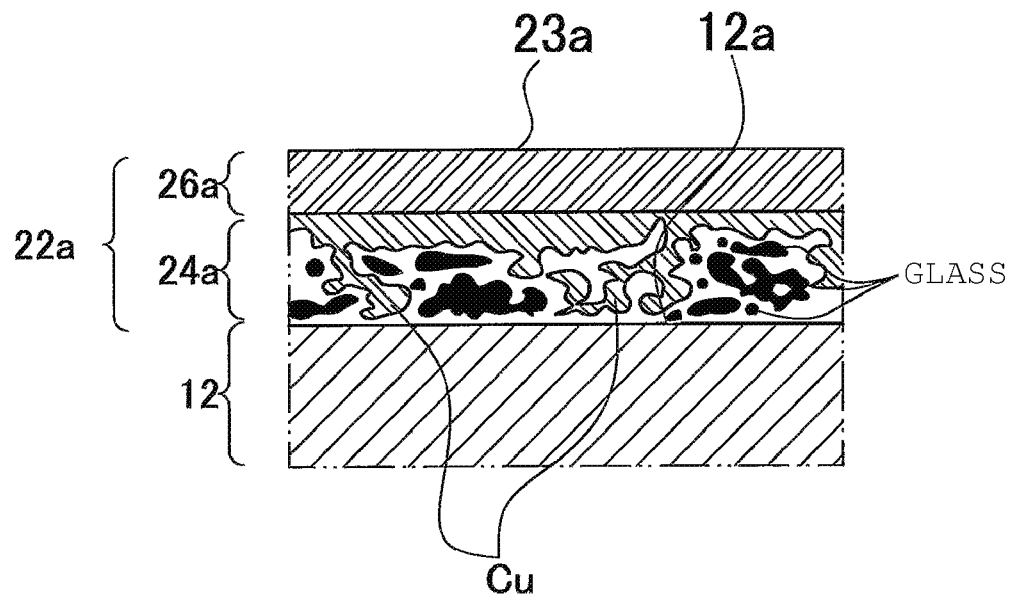
FIG. 4 is a schematic cross-sectional view illustrating a metal of a Cu plated layer of an external electrode, which penetrates into a base layer.

In this regard, when the plated layers 26a, 26b are entirely composed of Cu, the Cu metal of the plated layers 26a, 26b is present in the base layers 24a, 24b to a position of about ⅓ or more of the thicknesses of the base layers 24a, 24b respectively from the surface layers of the base layers 24a, 24b, as shown in FIG. 4. Further, in regard to penetration of the Cu metal of the Cu plated layers 26a, 26b into the base layers 24a, 24b, the Cu metal of the plated layers 26a, 26b is preferably present at about 30% or more with respect to the total proportion of the Cu metal of the base layers 24a, 24b and plated layers 26a, 26b on lines, when the lines are drawn along the portion of about ⅓ in thickness from the surface layers of the base layers 24a, 24b in any observation field of view of about 30 μm in x-axis and about 30 μm in y-axis, including the base layers 24a, 24b formed on the principal surfaces of the ceramic body at a polished surface obtained by polishing the side surface (surface LT) of the multilayer ceramic capacitor 10 along the length direction L until reaching about ½ the dimension in the width direction W.

More specifically, the Cu plated layers 26a, 26b preferably are formed with the use of a pyrophosphoric acid Cu plating solution or a cyanide Cu plating solution, for example. These plating solutions with high glass erosion capability, efficiently dissolve the glass contained in the base layer 24a, 24b, and easily cause the Cu metal of the Cu plated layers 26a, 26b to penetrate into the base layer 24a, 24b, thus making it possible to improve the content rate of Cu in the base layers 24a, 24b.

In this regard, the glass in the base layers 24a, 24b is preferably composed of glass containing BaO in an amount of about 10 weight % or more and about 50 weight % or less, SrO in an amount of about 10 weight % or more and about 50 weight % or less, $B_2O_3$ in an amount of about 3 weight % or more and about 30 weight % or less, and $SiO_2$ in an amount of about 3 weight % or more and about 30 weight % or less. Thus, in the formation of the Cu plated layers 26a, 26b with the use of a pyrophosphoric acid Cu plating solution or a cyanide Cu plating solution, for example, the glass contained in the base layers 24a, 24b is dissolved reliably.

It is to be noted that whether the Cu metal of the Cu plated layers 26a, 26b penetrates into the base layers 24a, 24b or not can be confirmed by polishing the side surface (surface LT) of the multilayer ceramic capacitor 10 along the length direction L until reaching about ½ the dimension in the width direction W, and observing the polished surface with an optical microscope.

Furthermore, the metal thicknesses of the external electrodes 22a, 22b are about 8.7 μm or more and about 13.9 μm or less. The metal thickness refers to a value obtained by measuring the thickness of the metal with a fluorescent X-ray film thickness meter (SFT-9400 from Seiko Instruments Inc.), and converting the measured X-ray Cu amount into a film thickness.

Furthermore, the plated layers 26a, 26b as outermost layers may have surfaces oxidized. In regard to the area of the oxidation, at least ridges of the external electrodes 22a, 22b are preferably oxidized.

This is because with the oxidized plated layers 26a, 26b as outermost layers, when the multilayer ceramic capacitor 10 is embedded into a multilayer printed wiring board, the oxidized film surfaces and a resin of the multilayer printed wiring board are attached through oxygen binding due to the plated layers 26a, 26b oxidized between the plated layers 26a, 26b of the multilayer ceramic capacitor 10 and the resin of the multilayer printed wiring board, and the adhesion is thus improved between the multilayer ceramic capacitor 10 and the multilayer printed wiring board. It is to be noted that the effect mentioned above is greater when the entire surfaces of the external electrodes 22a, 22b are oxidized.

In this regard, the arithmetic mean roughness (Ra) at the surfaces of the external electrodes 22a, 22b is preferably larger than the arithmetic mean roughness (Ra) at the surface of the ceramic body 12. More specifically, the ratio of the arithmetic mean roughness (Ra) at the surface of the ceramic body 12/the arithmetic mean roughness (Ra) at the surfaces of the external electrodes 22a, 22b preferably falls within the range of about 0.06 or more and about 0.97 or less.

In the case of the multilayer ceramic capacitor 10, the arithmetic mean roughness (Ra) at the surfaces of the external electrodes 22a, 22b is preferably larger than the arithmetic mean roughness (Ra) at the surface of the ceramic body 12. More specifically, the ratio of the arithmetic mean roughness (Ra) at the surface of the ceramic body 12/the arithmetic mean roughness (Ra) at the surfaces of the external electrodes 22a, 22b falls within the range of about 0.06 or more and about 0.97 or less. Thus, in close contact between the resin of the multilayer printed wiring board and the multilayer ceramic capacitor 10, the close contact between the external electrodes 22a, 22b and the resin in the embedding recess for the capacitor, which is provided in the multilayer printed wiring board, is stronger than the close contact between the ceramic body 12 and the resin in the embedding recess for the capacitor, which is provided in the multilayer printed wiring board. Therefore, gaps are more unlikely to be produced between the external electrodes 22a, 22b and the resin in the embedding recess for the capacitor, which is provided in the multilayer printed wiring board, and ingress of moisture into the gaps is thus also suppressed or prevented. As a result, reliability of resistance to moisture is ensured for the multilayer ceramic capacitor 10.

In the calculation of the arithmetic mean roughness (Ra) at the surface of the ceramic body 12, as a measurement condition, a laser microscope (Product Name: VK-9510) from Keyence Corporation is preferably used at a 100-fold lens magnification in a color ultradeep mode set. The measurement area with the laser microscope is regarded as a region of about 90 μm square including a central portion of the principal surface 12a of the ceramic body 12. Then, the arithmetic mean roughness (Ra) at the surface of the ceramic body 12 is regarded as a value calculated on the basis of the surface roughness measured under the measurement condition.

On the other hand, in the calculation of the arithmetic mean roughness (Ra) at the surfaces of the external electrodes 22a, 22b, as a measurement condition, a laser microscope (Product Name: VK-9510) from Keyence Corporation is preferably used at a 100-fold lens magnification in a color ultradeep mode set. The measurement area with the laser microscope is regarded as a region of about 90 μm square including central portions of portions of the external electrode 22a or external electrode 22b provided on the principal surface 12a or the principal surface 12b (principal surface portions 23a to 23d).

Then, the arithmetic mean roughness (Ra) at the surfaces of the external electrodes 22a, 22b is regarded as a value calculated on the basis of the surface roughness measured under the measurement condition.

Figure 5:
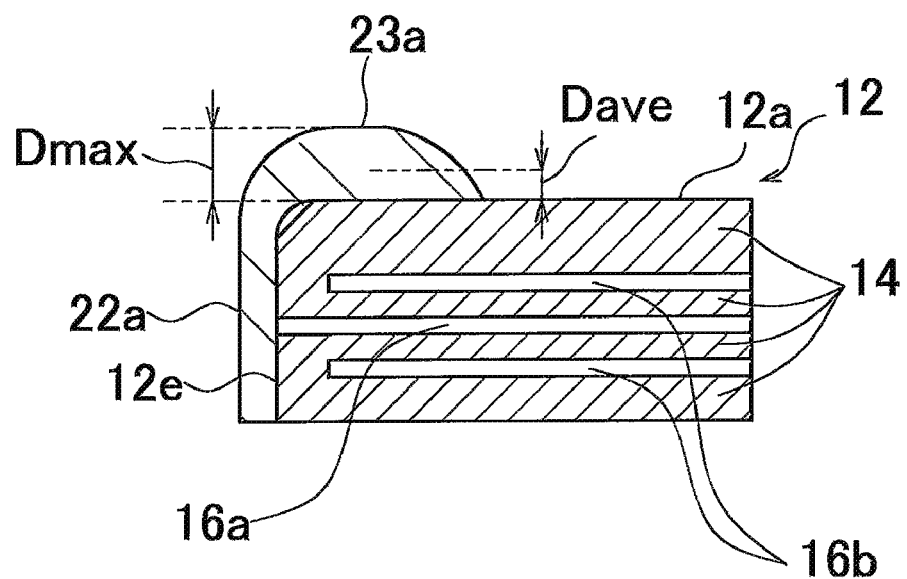
FIG. 5 is a drawing illustrating a preferred embodiment of a multilayer ceramic capacitor according to the present invention, which is able to achieve a greater effect, specifically, an explanatory drawing for schematically explaining a maximum thickness $D_{max}$ and an average thickness $D_{ave}$ of a principal surface portion.

Furthermore, in regard to the principal surface portions 23a, 23b of the first external electrode 22a disposed on the principal surfaces 12a, 12b of the ceramic body 12, as shown in FIG. 5, when the maximum thickness and average thickness of the principal surface portions 23a, 23b are denoted respectively by $D_{max}$ and $D_{ave}$, the $D_{max}$ and $D_{ave}$ are preferably set so as to satisfy the condition expression of $D_{ave} \times 250\% \geq D_{max} \geq D_{ave} \times 120\%$. Likewise, in regard to the principal surface portions 23c, 23d of the second external electrode 22b disposed on the principal surfaces 12a, 12b of the ceramic body 12, when the maximum thickness and average thickness of the principal surface portions 23c, 23d are denoted respectively by $D_{max}$ and $D_{ave}$, the $D_{max}$ and $D_{ave}$ are preferably set so as to satisfy the condition expression of $D_{ave} \times 250\% \geq D_{max} \geq D_{ave} \times 120\%$. The adoption of this structure achieves a more pronounced effect.

When the multilayer ceramic capacitor 10 is formed so that the maximum thicknesses $D_{max}$ and average thicknesses $D_{ave}$ of the principal surface portions 23a to 23d of the external electrodes 22a, 22b on the principal surfaces 12a, 12b satisfy the condition expression of $D_{ave} \times 250\% \geq D_{max} \geq D_{ave} \times 120\%$, the principal surface portions 23a to 23d are increased in thickness, and principal surface portions 23a to 23d function as cushioning materials, and disperse the mounting load (stress) applied in suctioning the multilayer ceramic capacitor 10 with a suction nozzle of a mounting machine (mounter) or pushing the capacitor into a multilayer printed wiring board.

As a result, the generation of breakages and cracks is significantly reduced or prevented without concentrating the mounting load (stress) on portions of the multilayer ceramic capacitor 10 with mechanical strength decreased.

The maximum thickness $D_{max}$ and the average thickness $D_{ave}$ are measured by polishing the side surface of the multilayer ceramic capacitor 10 along the length direction L until reaching about ½ the dimension in the width direction W, and observing the polished surface with an optical microscope.

In addition, when the impurity is potassium, which is present on the surfaces of the outermost Cu plated layers of the plated layers 26a, 26b of the external electrodes 22a, 22b and the surface of the ceramic body 12, the multilayer ceramic capacitor 10 is preferably treated so that the concentration of impurity potassium is about 0.30 ppm or less. Alternatively, when the impurity is sulfur, which is present on the surfaces of the outermost Cu plated layers of the plated layers 26a, 26b of the external electrodes 22a, 22b and the surface of the ceramic body 12, the multilayer ceramic capacitor 10 is preferably treated so that the concentration of impurity sulfur is about 0.40 ppm or less.

Figure 6:
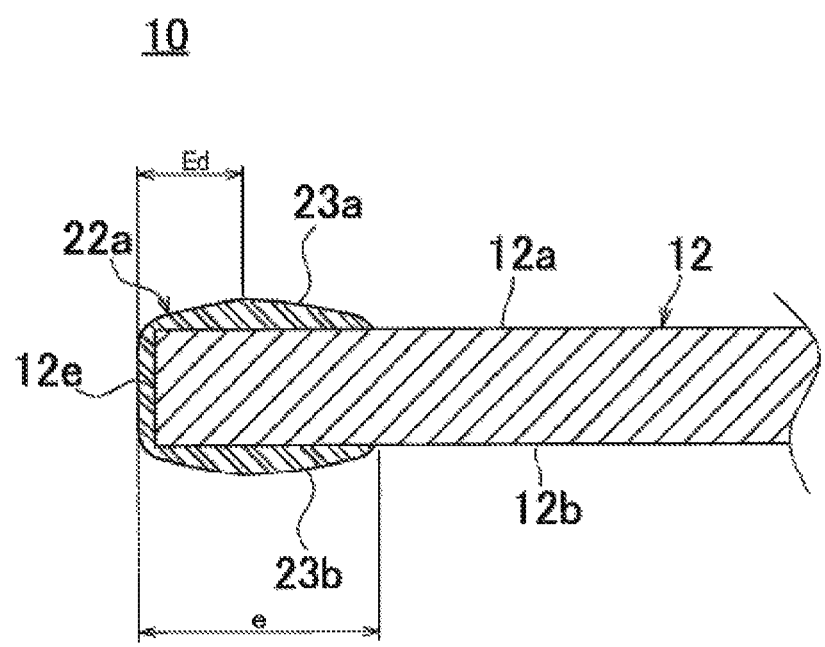
FIG. 6 is a schematic drawing for explaining the shape of an external electrode of a multilayer ceramic capacitor according to a preferred embodiment of the present invention, which is able to achieve a greater effect.

Furthermore, FIG. 6 is a schematic drawing for explaining the shape of the external electrode 22a, 22b of the multilayer ceramic capacitor 10 according to a preferred embodiment of the present invention, which is able to achieve a greater effect, and an enlarged view around the external electrode 22a in FIG. 3. It is to be noted that because the external electrode 22b has the same shape as the external electrode 22a, the explanation will not be repeated herein.

The external electrode 22a of the multilayer ceramic capacitor 10 according to this preferred embodiment is preferably formed so that when the distance from the position of the maximum thickness on the principal surface 12a of the ceramic body 12 to the position of the maximum thickness on the end surface 12e of the ceramic body 12 is referred to as a dimension Ed, whereas the distance from the position of the maximum thickness on the end surface 12e of the ceramic body 12 to an edge end of the external electrode 22a on the principal surface 12a of the ceramic body 12 is referred to as a dimension e, the ratio Ed/e is about 0.243 or more and about 0.757 or less. The adoption of this structure achieves a more pronounced effect.

More specifically, in the case of the multilayer ceramic capacitor 10, the external electrodes 22a, 22b are preferably formed so that when the distance from the position of the maximum thickness on the principal surface 12a of the ceramic body 12 to the position of the maximum thickness on the end surface 12e of the ceramic body 12 is referred to as a dimension Ed, whereas the distance from the position of the maximum thickness on the end surface 12e of the ceramic body 12 to an edge end of the external electrode 22a on the principal surface 12a of the ceramic body 12 is referred to as a dimension e, the ratio Ed/e is about 0.243 or more and about 0.757 or less. Thus, the stress concentration which is generated at corners of the multilayer ceramic capacitor 10 is significantly reduced or prevented. As a result, it becomes possible to suppress or prevent peeling that is generated between the corners of the multilayer ceramic capacitor 10 and the resin in the embedding recess for the capacitor, which is provided in the multilayer printed wiring board.

The dimension Ed and the dimension e are measured by polishing, for a cross section, the side surface of the multilayer ceramic capacitor 10 along the length direction L until reaching about ½ the dimension in the width direction W, and observing the polished surface with an optical microscope.

Figure 7:
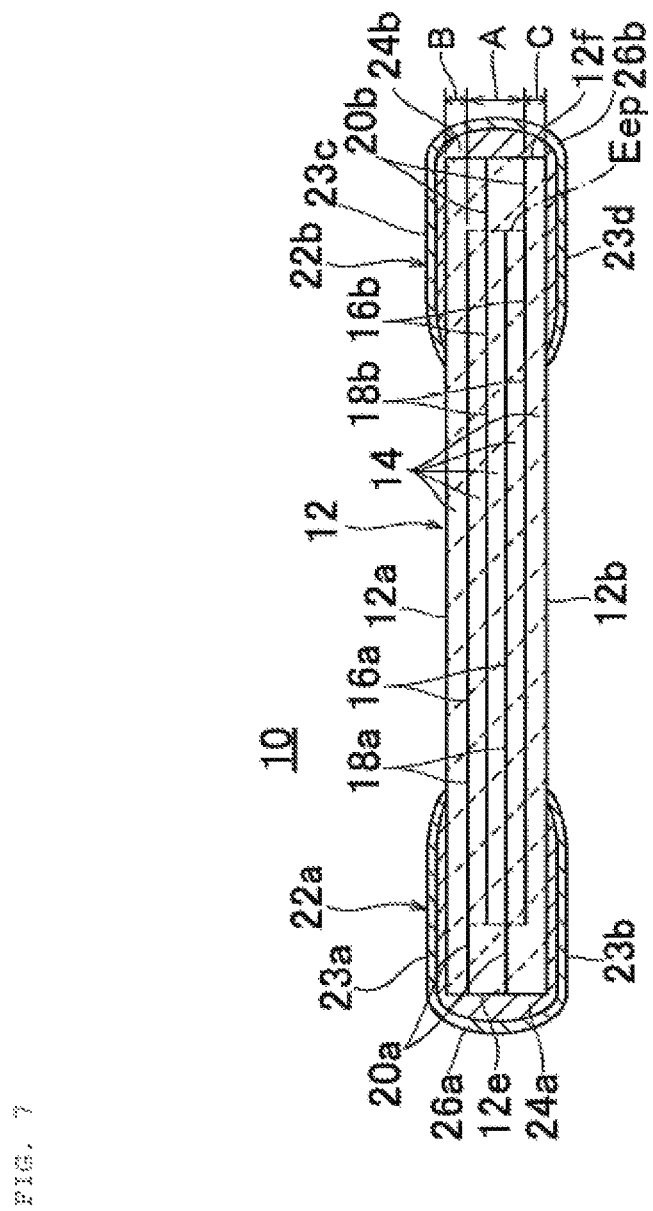
FIG. 7 shows a cross-sectional view of a preferred embodiment of a multilayer ceramic capacitor according to the present invention, which is able to achieve a greater effect, along the line III-III of FIG. 1.

Furthermore, FIG. 7 shows a cross-sectional view of a preferred embodiment of a multilayer ceramic capacitor according to the present invention, which is able to achieve a greater effect, along the line III-III of FIG. 1.

The height of an effective portion that is a portion of the ceramic body 12 where the first internal electrodes 16a and the second internal electrode 16b are provided is referred to as A in the height direction T. The height of the ceramic layer 14 for outer layer that is a portion of the ceramic body 12 located closer to the principal surface 12a than the effective portion is referred to as B in the height direction T. The height of the ceramic layer 14 for outer layer that is a portion of the ceramic body 12 located closer to the principal surface 12d than the effective portion is referred to as C in the height direction T. In this case, the ratios A/B and A/C each preferably falls within the range of about 0.5 to about 16.

Furthermore, in regard to the multilayer ceramic capacitor 10, when the dimension in the height direction T is about 50 μm to about 150 μm, the ratios of A/B and A/C each preferably fall within the range of about 0.6 to about 6.

In addition, in regard to the multilayer ceramic capacitor 10, when the dimension in the height direction T is about 150 μm to about 250 μm, the ratios of A/B and A/C each preferably fall within the range of about 2 to about 16.

As just described, in regard to the multilayer ceramic capacitor 10, when the ratios of A/B and A/C each fall within the range of about 0.5 to about 16, the crack generation in the ceramic body 12 which starts from the contact point between the principal surface 12a of the ceramic body 12 and the end of the external electrode 22a is effectively suppressed or prevented. As the reason therefor, the following reason is considered.

In the multilayer ceramic capacitor 10, the ratios A/B and A/C each falls within the range of about 0.5 to about 16, thus leading to the small height ratio of the ceramic layers 14 for outer layers closer to the principal surface 12a and the principal surface 12b to the effective portion Eep. More specifically, the ceramic layers 14 for outer layers closer to the principal surface 12a and the principal surface 12b are relatively small in height. For this reason, when the ceramic body 12 is subjected to firing, compressive stress applied to the ceramic layers 14 for outer layers closer to the principal surface 12a and the principal surface 12b is likely to be increased, due to contraction of electrode paste layers defining the internal electrodes 16a, 16b. For this reason, for example, in the case of baking the external electrodes 22a, 22b after firing the ceramic body 12, the compressive stress of the ceramic layers 14 for outer layers closer to the principal surface 12a and the principal surface 12b can be increased before baking the external electrodes 22a, 22b. For this reason, tensile stress is less likely to be applied to the ceramic body 12, even when the electrode paste layers defining the external electrodes 22a, 22b are contracted in baking the external electrodes 22a, 22b. Therefore, the ceramic body 12 is less likely to be cracked. Even in the case of simultaneously carrying out firing for the ceramic body 12 and firing defining the external electrodes 22a, 22b, tensile stress is less likely to be applied to the ceramic body 12 for the same reason, and thus is less likely to be applied to the ceramic body 12.

From the perspective of effectively suppressing or preventing the crack generation in the ceramic body 12, when the dimension of the multilayer ceramic capacitor 10 in the height direction T is about 50 µm to about 150 µm, the ratios of A/B and A/C each preferably fall within the range of about 0.6 to about 6.

When the dimension of the multilayer ceramic capacitor 10 in the height direction T is about 150 µm to about 250 µm, the ratios of A/B and A/C each preferably fall within the range of about 2 to about 16.

It is to be noted that A, B, and C can be measured in the following manner. More specifically, a cross section is exposed by polishing the side surface 12c of the multilayer ceramic capacitor 10 until the dimension in the width direction W is reduced down to about ½. A, B, and C can be measured at the center of the cross section in the length direction with the use of an optical microscope. The height A can be measured at a portion located in the center of the cross section in the length direction and in the center thereof in the height direction T.

Figure 8:
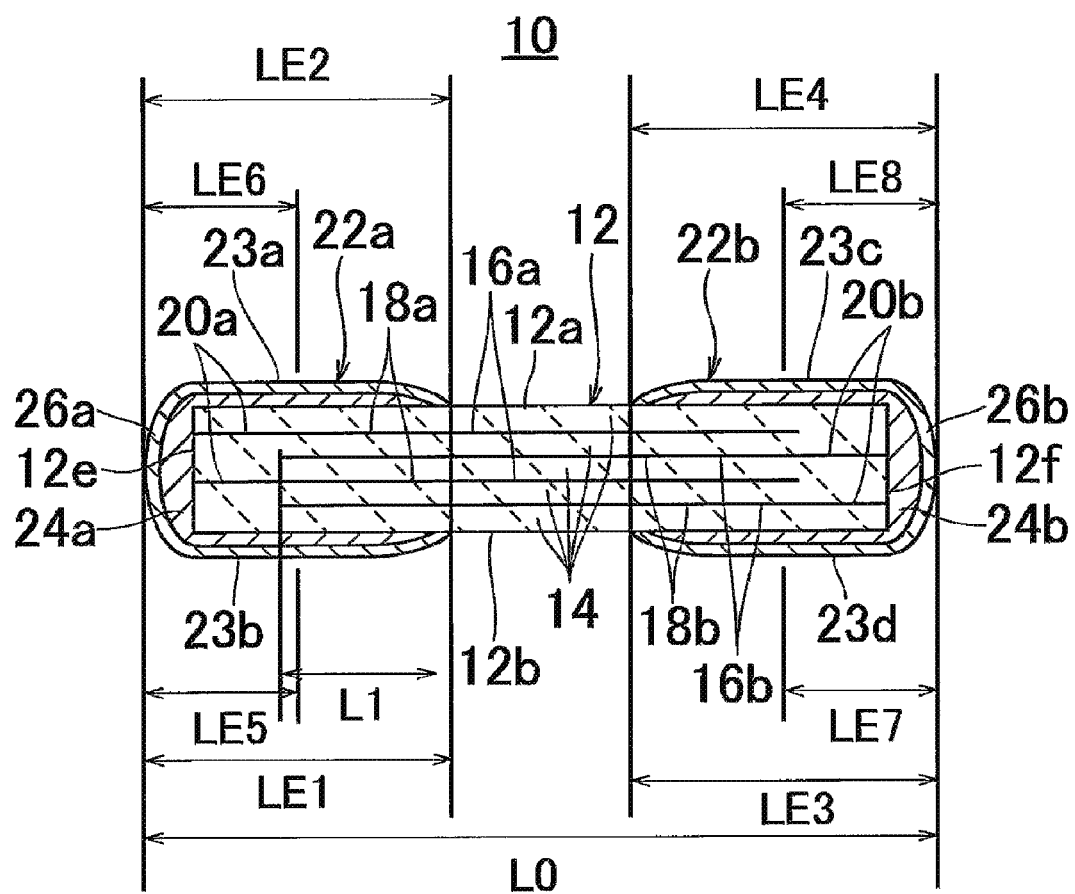
FIG. 8 shows a cross-sectional view of a preferred embodiment of a multilayer ceramic capacitor according to the present invention, which is able to achieve a greater effect, along the line III-III of FIG. 1.

Furthermore, FIG. 8 shows a cross-sectional view of a preferred embodiment of a multilayer ceramic capacitor according to the present invention, which is able to achieve a greater effect, along the line III-III of FIG. 1.

More specifically, in the multilayer ceramic capacitor 10, when the dimension in the length direction L of the multilayer ceramic capacitor 10 is referred to as L0, whereas the distance in the length direction L is referred to as L1 between an end in the length direction L of a portion of the first external electrode 22a located on the principal surface 12a and an end of the second internal electrode 16b closer to the end surface 12e, the ratio of L1/L0 is preferably about 0.05 to about 0.35. Accordingly, the ceramic body 12 is unlikely to be cracked in the multilayer ceramic capacitor 10. The ratio of L1/L0 is more preferably about 0.13 or more.

Further, in regard to L0, a cross section is exposed by polishing the side surface 12c, 12d of the multilayer ceramic capacitor 10 until the dimension in the width direction W is reduced down to about ½. The cross section can be observed with the use of an optical microscope to make a dimension measurement.

In regard to L1, a cross section is exposed by polishing the side surface 12c, 12d of the multilayer ceramic capacitor 10 until the dimension in the width direction W is reduced down to about ½. The cross section is observed with the use of an optical microscope to first specify the second internal electrode 16b closest to the end surface 12e. Then, the dimension can be obtained by measuring the distance in the length direction L between the second internal electrode 16b and the end surface 12e.

In addition, in this regard, the length of the first external electrode 22a in the length direction L is referred to as LE1 as viewed from the principal surface 12b. The length of the first external electrode 22a in the length direction L is referred to as LE2 as viewed from the principal surface 12a. The length of the second external electrode 22b in the length direction L is referred to as LE3 as viewed from the principal surface 12b. The length of the second external electrode 22b in the length direction L is referred to as LE4 as viewed from the principal surface 12a. The distance in the length direction L is referred to as LE5 between the thickest portion of the first external electrode 22a located on the principal surface 12b and the outermost end of the first external electrode 22a in the length direction L. The distance in the length direction L is referred to as LE6 between the thickest portion of the first external electrode 22a located on the principal surface 12a and the outermost end of the first external electrode 22a in the length direction L. The distance in the length direction L is referred to as LE7 between the thickest portion of the second external electrode 22b located on the principal surface 12b and the outermost end of the second external electrode 22b in the length direction L. The distance in the length direction L is referred to as LE8 between the thickest portion of the second external electrode 22b located on the principal surface 12a and the outermost end of the second external electrode 22b in the length direction L. The ratio of the absolute value of the difference between LE5 and LE6 to the longer one of LE1 and LE2 ((absolute value of difference between LE5 and LE6)/(longer one of LE1 and LE2)) is referred to as A1. The ratio of the absolute value of the difference between LE7 and LE8 to the longer one of LE3 and LE4 ((absolute value of difference between LE7 and LE8)/(longer one of LE3 and LE4)) is referred to as A2.

In this case, in the multilayer ceramic capacitor 10, A1 and A2 are each preferably about 0.2 or more. Thus, the ceramic body 10 is more unlikely to be cracked in mounting the multilayer ceramic capacitor 10 onto a mounting substrate with the use of a mounter.

Further, in regard to LE1 and LE3, a cross section is exposed by polishing the side surface 12c, 12d of the multilayer ceramic capacitor 10 until the dimension in the width direction W is reduced down to about ½. The dimensions can be obtained by observing the cross section of the multilayer ceramic capacitor from the principal surface 12b with the use of an optical microscope, and measuring the length of the external electrode in the center in the width direction W.

In addition, in regard to LE2 and LE4, a cross section is exposed by polishing the side surface 12c, 12d of the multilayer ceramic capacitor 10 until the dimension in the width direction W is reduced down to about ½. The dimensions can be obtained by observing the cross section of the multilayer ceramic capacitor 10 from the principal surface 12a with the use of an optical microscope, and measuring the length of the external electrode in the center in the width direction W.

In addition, in regard to LE5 to LE8, a cross section is first exposed by polishing the side surface 12c, 12d of the multilayer ceramic capacitor 10 until the dimension in the width direction W is reduced down to about ½. This cross section is observed with the use of an optical microscope to specify the thickest portion of the external electrode located on the principal surface. Next, the dimensions can be obtained by measuring the distance between the thickest portion and the outermost end of the external electrode.

Figure 9:
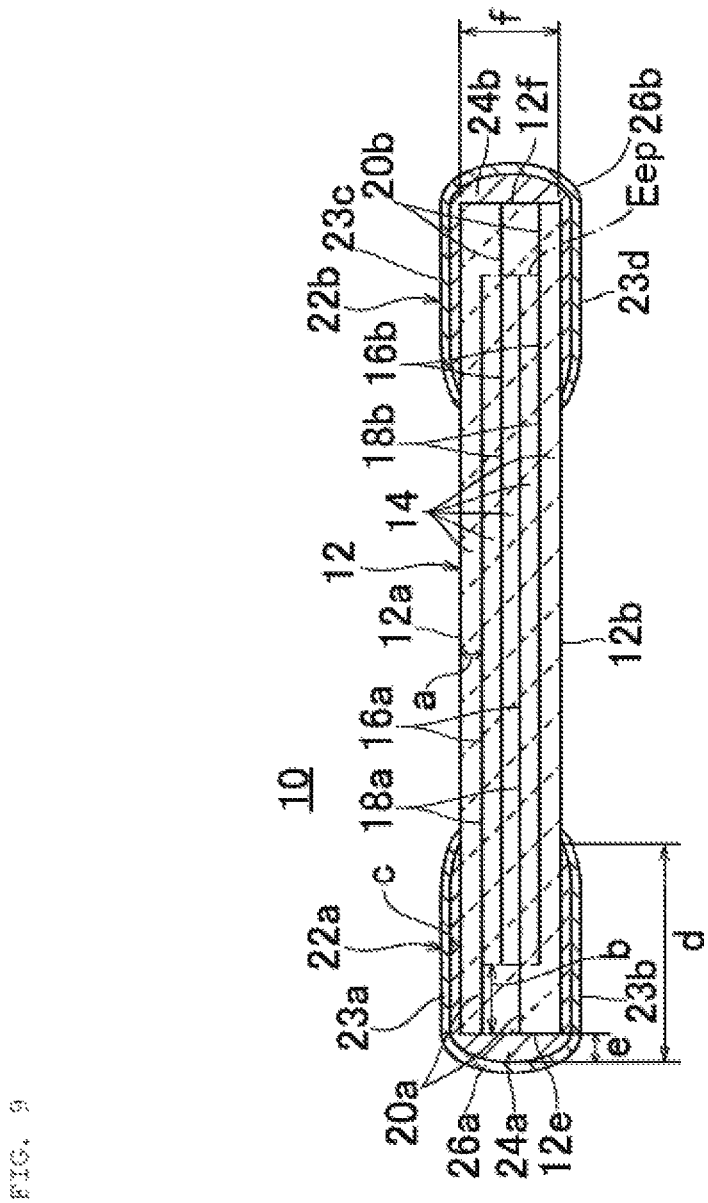
FIG. 9 shows a cross-sectional view of a preferred embodiment of a multilayer ceramic capacitor according to the present invention, which is able to achieve a greater effect, along the line III-III of FIG. 1.

FIG. 9 shows a cross-sectional view of a preferred embodiment of a multilayer ceramic capacitor according to the present invention, which is able to achieve a greater effect, along the line III-III of FIG. 1.

In this regard, in the multilayer ceramic capacitor 10, the dimensions a, b, c, d, e, and f shown in FIG. 9 are defined as follows: "a" is a distance in the height direction between the principal surface 12a and an effective portion E that refers to a region where the first internal electrodes 16a and the second internal electrodes 16b are opposed in the height direction T; "b" is a distance in the length direction between the end surface 12e and the effective portion Eep in the length direction L; "c" is a thickness of the thickest portion of the base layer 24a provided over the principal surface 12a; "d" is a distance in the length direction L between a point of the base layer 24a over the end surface 12e which is farthest from the end surface 12e and an end of the base layer 24a over the principal surface 12a which is closest to the end surface 12f; "e" is a thickness of the thickest portion of the base layer 24a provided over the end surface 12e; and "f" is a height of the ceramic body 12.

In the multilayer ceramic capacitor 10, the ratio (c·d+e·f/2)/(a·b) is preferably about 6 or less. For this reason, with a large (a·b), the ridges of the ceramic body 12 are increased in strength. In addition, the tensile stress applied to the ridges of the ceramic body 12 is low because the base layer 24a is thin with a small (c·d+e·f/2). Therefore, the multilayer ceramic capacitor 10 is unlikely to be cracked from the ridges of the ceramic body 12.

Furthermore, the ratio (c·d+e·f/2)/(a·b) is preferably about 2 or more. Thus, the base layer 24a can be made not to be excessively thin. Accordingly, the multilayer ceramic capacitor 10 has excellent resistance to moisture.

Further, the thicknesses of the base layers 24a, 24b can be measured through the observation of, with a microscope, a cross section exposed by polishing the side surface 12c or side surface 12d of the multilayer ceramic capacitor 10 until the height of the multilayer ceramic capacitor 10 is reduced to about ½.

The distance a in the height direction between the effective portion Eep where the first internal electrodes 16a and the second internal electrodes 16b are opposed in the height direction T, and the principal surface 12a can be measured through the observation of, with a microscope, a cross section exposed by polishing the side surface 12c or side surface 12d of the multilayer ceramic capacitor 10 until the height of the multilayer ceramic capacitor 10 is reduced to about ½.

In the length direction L, the distance b in the length direction between the end surface 12e and the effective portion Eep is regarded as the distance between the second internal electrode 16b extending closest to the end surface 12e among the second internal electrodes 16b and the end surface 12e in a cross section exposed by polishing the side surface 12c or side surface 12d of the multilayer ceramic capacitor 10 until the height of the multilayer ceramic capacitor 10 is reduced to about ½.

The height f of the ceramic body 12 can be obtained by measuring the height of the center in the width direction W in a cross section exposed by polishing the end surface 12e or end surface 12f of the ceramic body 12 until the height of the ceramic body 12 in the length direction L is reduced to about ½.

Figure 10:
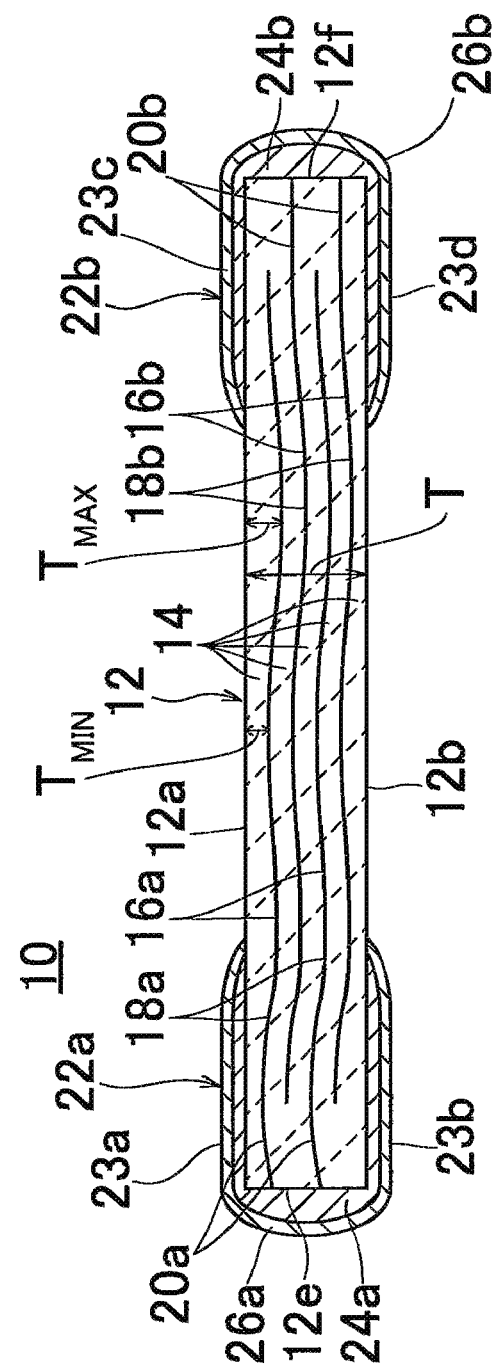
FIG. 10 shows a cross-sectional view of a preferred embodiment of a multilayer ceramic capacitor according to the present invention, which is able to achieve a greater effect, along the line III-III of FIG. 1.

Furthermore, FIG. 10 shows a cross-sectional view of a preferred embodiment of a multilayer ceramic capacitor according to the present invention, which is able to achieve a greater effect, along the line III-III of FIG. 1. The multilayer ceramic capacitor 10 according to the present invention is achieved by meeting any of the conditions (1) to (5) listed below.

Condition 1
The internal electrode located closest to the principal surface 12a is configured so that the multilayer ceramic capacitor 10 is about 0.9 mm or more and about 1.1 mm or less in dimension in the length direction L, the multilayer ceramic capacitor 10 is about 0.4 mm or more and about 0.6 mm or less in dimension in the width direction W, the multilayer ceramic capacitor 10 is about 0.085 mm or more and about 0.11 mm or less in dimension in the height direction T, and the ratio $(T_{MAX}-T_{MIN})/T$ of about 1.0% to about 5.0% is met. The target dimensions of the multilayer ceramic capacitor 10 preferably are about 1.0 mm in dimension in the length direction L, about 0.5 mm in dimension in the width direction W, and about 0.10 mm in dimension in the height direction T.

Condition 2
The internal electrode located closest to the principal surface 12a is configured so that the multilayer ceramic capacitor 10 is about 0.9 mm or more and about 1.1 mm or less in dimension in the length direction L, the multilayer ceramic capacitor 10 is about 0.4 mm or more and about 0.6 mm or less in dimension in the width direction W, the multilayer ceramic capacitor 10 is about 0.12 mm or more and about 0.15 mm or less in dimension in the height direction T, and the ratio $(T_{MAX}-T_{MIN})/T$ of about 1.3% to about 5.3% is met. The target dimensions of the multilayer ceramic capacitor 10 preferably are about 1.0 mm in dimension in the length direction L, about 0.5 mm in dimension in the width direction W, and about 0.15 mm in dimension in the height direction T.

Condition 3
The internal electrode located closest to the principal surface 12a is configured so that the multilayer ceramic capacitor 10 is about 0.9 mm or more and about 1.1 mm or less in dimension in the length direction L, the multilayer ceramic capacitor 10 is about 0.4 mm or more and about 0.6 mm or less in dimension in the width direction W, the multilayer ceramic capacitor 10 is about 0.18 mm or more and about 0.20 mm or less in dimension in the height direction T, and the ratio $(T_{MAX}-T_{MIN})/T$ of about 1.5% to about 5.0% is met (the target dimensions of the multilayer ceramic capacitor 10 are about 1.0 mm in dimension in the length direction L, about 0.5 mm in dimension in the width direction W, and about 0.20 mm in dimension in the height direction T.

Condition 4
The internal electrode located closest to the principal surface 12a is configured so that the multilayer ceramic capacitor 10 is about 0.9 mm or more and about 1.1 mm or less in dimension in the length direction L, the multilayer ceramic capacitor 10 is about 0.4 mm or more and about 0.6 mm or less in dimension in the width direction W, the multilayer ceramic capacitor 10 is about 0.21 mm or more and about 0.23 mm or less in dimension in the height direction T, and the ratio $(T_{MAX}-T_{MIN})/T$ of about 1.8% to about 5.9% is met. The target dimensions of the multilayer ceramic capacitor 10 preferably are about 1.0 mm in dimension in the length direction L, about 0.5 mm in dimension in the width direction W, and about 0.22 mm in dimension in the height direction T.

Condition 5
The internal electrode located closest to the principal surface 12a is configured so that the multilayer ceramic capacitor 10 is about 0.9 mm or more and about 1.1 mm or less in dimension in the length direction L, the multilayer ceramic capacitor 10 is about 0.4 mm or more and about 0.6 mm or less in dimension in the width direction W, the multilayer ceramic capacitor 10 is about 0.24 mm or more and about 0.30 mm or less in dimension in the height direction T, and the ratio $(T_{MAX}-T_{MIN})/T$ of about 1.2% to about 6.0% is met. The target dimensions of the multilayer ceramic capacitor 10 preferably are about 1.0 mm in dimension in the length direction L, about 0.5 mm in dimension in the width direction W, and about 0.25 mm in dimension in the height direction T.

This multilayer ceramic capacitor 10 preferably meets any of the conditions (1) to (5). Thus, the ceramic body 12 is reinforced in a preferred manner with the first internal electrodes 16a and the second internal electrodes 16b, and the stress applied to the ceramic body 12 when the multilayer ceramic capacitor 10 is mounted with the use of a mounter is dispersed. Accordingly, the ceramic body 12 is more unlikely to be cracked in mounting the multilayer ceramic capacitor 10. Because cracks are unlikely to be generated, the generation of short circuit defects in the multilayer ceramic capacitor 10 is also effectively suppressed or prevented.

It is to be noted that T, $T_{MAX}$, and $T_{MIN}$ can be each measured by observing, with the use of a microscope, a cross section exposed by polishing the end surface 12e or end surface 12f of the multilayer ceramic capacitor 10 until the dimension in the length direction L is reduced down to about ½.

Figure 11:
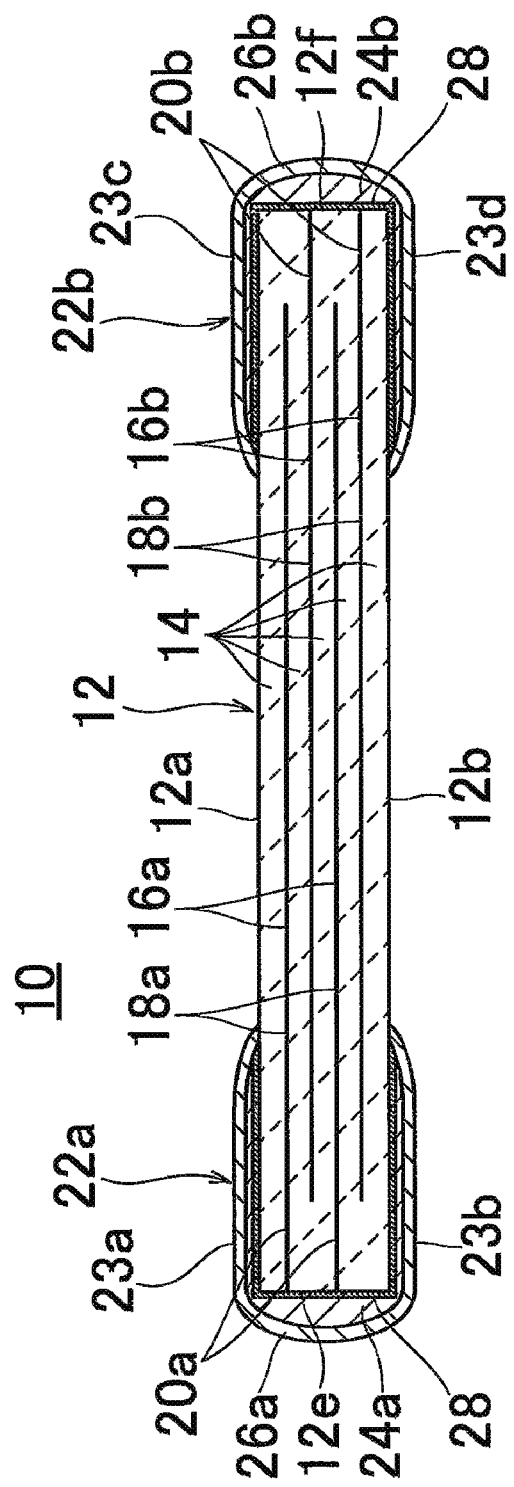
FIG. 11 shows a cross-sectional view of a preferred embodiment of a multilayer ceramic capacitor according to the present invention, which is able to achieve a greater effect, along the line III-III of FIG. 1.

Furthermore, FIG. 11 shows a cross-sectional view of a preferred embodiment of a multilayer ceramic capacitor according to the present invention, which is able to achieve a greater effect, along the line III-III of FIG. 1.

Multilayer ceramic capacitors preferably have external electrodes that are unlikely to be peeled from ceramic bodies. In the multilayer ceramic capacitor 10, reactive layers 28 containing about 5 atomic % to about 15 atomic % of Ti, about 5 atomic % to about 15 atomic % of Si, and about 2 atomic % to about 10 atomic % of V are preferably provided between the ceramic body 12 and the base layers 24a, 24b. Thus, in the multilayer ceramic capacitor 10, the external electrodes 22a, 22b are unlikely to be peeled from the ceramic body 12.

It is to be noted that as a cause of the fact that the external electrodes are unlikely to be peeled, for example, it is conceivable that when the ceramic body with the base layers formed is immersed in a plating bath in order to form plated layers, glass in the base layers is eluted to decrease the adhesion strength between the base layers and the ceramic body. The reactive layers 28 containing about 5 atomic % to about 15 atomic % of Ti, about 5 atomic % to about 15 atomic % of Si, and about 2 atomic % to about 10 atomic % of V are preferably formed between the ceramic body 12 and the base layers 24a, 24b. The reactive layer 28 which has this composition is formed in such a way that the ceramic body 12 is reacted with a base paste in firing the ceramic body 12. The reactive layers 28 have low solubility in plating baths such as a sulfuric acid Cu bath, a pyrophosphoric acid Cu bath, and a cyanide Cu bath. For this reason, the adhesion strength between the base layers 24a, 24a and the ceramic body 12 is unlikely to be decreased in the case of forming the plated layers 26a, 26b by Cu plating. Accordingly, the external electrodes 22a, 22b are unlikely to be peeled on the ceramic body 12.

In addition, from the perspective of effective suppression or prevention of peeling of the external electrodes 22a, 22b, the maximum thickness of the reactive layer 28 is preferably about 0.5 μm to about 5 μm. The external electrodes is peeled from the ceramic body when the maximum thickness of the reactive layer 28 is smaller than about 0.5 μm, whereas the deflective strength is decreased because of a decrease in the strength itself of the ceramic body 12 when the maximum thickness of the reactive layer 28 is larger than about 5 μm.

Figure 12:
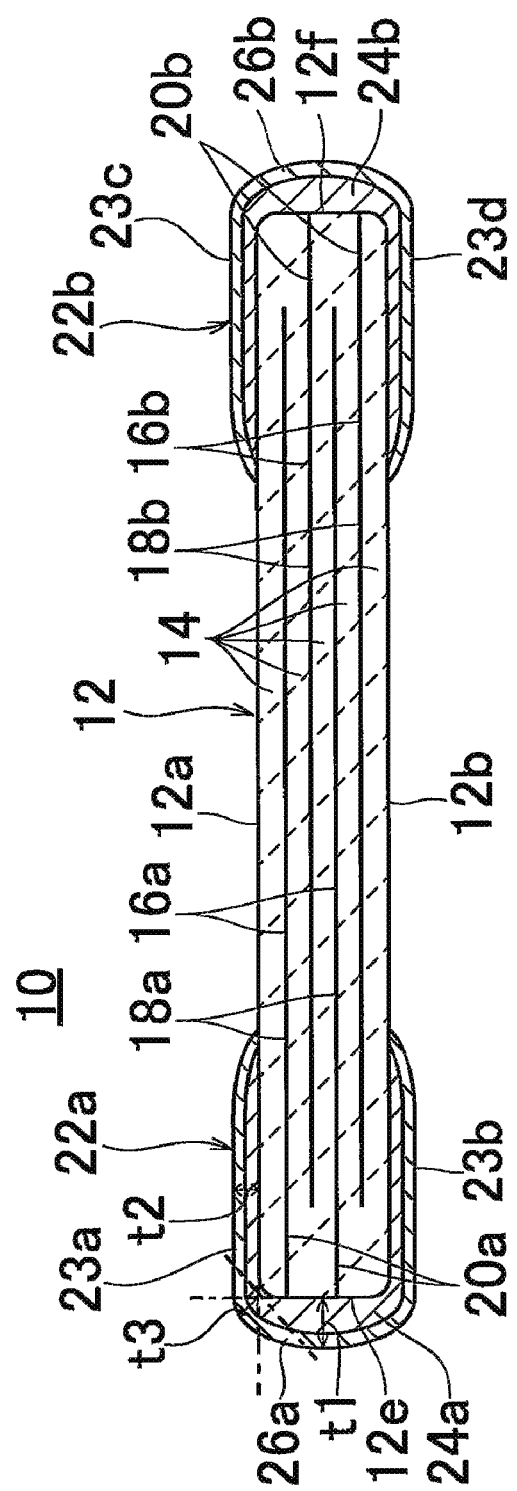
FIG. 12 shows a cross-sectional view of a preferred embodiment of a multilayer ceramic capacitor according to the present invention, which is able to achieve a greater effect, along the line III-III of FIG. 1.

Furthermore, FIG. 12 shows a cross-sectional view of a preferred embodiment of a multilayer ceramic capacitor according to the present invention, which is able to achieve a greater effect, along the line III-III of FIG. 1.

In this case, in the multilayer ceramic capacitor 10, the thickness of the thickest portion of the first external electrode 22a located on the end surface 12e is referred to as t1 in a cross section passing through the center in the width direction W and extending in the length direction L and the height direction T.

In addition, in the multilayer ceramic capacitor 10, the thickness of the thickest portion of the first external electrode 22a located on the principal surface 12a is referred to as t2 in a cross section passing through the center in the width direction W and extending in the length direction L and the height direction T.

Furthermore, in the multilayer ceramic capacitor 10, the thickness of the first external electrode 22a on a line passing through the point of intersection between a tangent line on a corner of the ceramic body 12 and the corner and the point of intersection between a line along the principal surface 12a and a line along the end surface 12e is referred to as t3 in a cross section passing through the center in the width direction W and extending in the length direction L and the height direction T.

The multilayer ceramic capacitor 10 preferably is embedded into a multilayer printed wiring board, and used. In such a case, the multilayer ceramic capacitor 10 preferably has excellent resistance to moisture, and excellent adhesion to the resin constituting the multilayer printed wiring board.

As a result of earnest study, it has been found that the shape of the external electrode is related to the moisture resistance of the multilayer ceramic capacitor 10 and the adhesion thereof to the resin. Specifically, the relationships among t1 to t3 can control the moisture resistance and the adhesion to the resin.

More specifically, in the multilayer ceramic capacitor 10, the ratio t2/t1 is preferably about 0.7 to about 1.0, and the ratio t3/t1 is preferably about 0.4 to about 1.2. Thus, the multilayer ceramic capacitor 10 has excellent resistance to moisture, and excellent adhesion to the resin of the multilayer printed wiring board.

An excessively small ratio t2/t1 may result in failure to sufficiently ensure the thicknesses of the external electrodes around corners of the ceramic body, and ingress of plating solutions, etc., into the multilayer ceramic capacitor 10, thus decreasing reliability of resistance to moisture. On the other hand, an excessively large ratio t2/t1 may eliminate the roundness of the external electrodes around corners of the ceramic body, and make stress more likely to be concentrated on the corners, thus decreasing the adhesion between the multilayer ceramic capacitor 10 and the resin of the multilayer printed wiring board.

An excessively small ratio t3/t1 may result in failure to sufficiently ensure the thicknesses of the external electrodes, and ingress of plating solutions, etc., into the multilayer ceramic capacitor 10, thus decreasing the moisture resistance. On the other hand, an excessively large ratio t3/t1 may eliminate the roundness of the external electrodes around corners of the ceramic body, and make stress more likely to be concentrated on the corners, thus decreasing the adhesion between the multilayer ceramic capacitor 10 and the resin of the multilayer printed wiring board.

It is to be noted that t1 to t3 can be measured in the following manner.

Method of T1 Measurement

A cross section is exposed by polishing the side surface 12c or side surface 12d of the multilayer ceramic capacitor 10 until the height of the multilayer ceramic capacitor 10 in the width direction W is reduced down to about ½. The thickness t1 of the thickest portion of the first external electrode 22a located on the end surface 12e can be measured by observing the cross section with the use of a microscope.

Method of T2 Measurement

A cross section is exposed by polishing the side surface 12c or side surface 12d of the multilayer ceramic capacitor 10 until the height of the multilayer ceramic capacitor 10 in the width direction W is reduced down to about ½. The thickness t2 of the thickest portion of the first external electrode 22a located on the principal surface 12a can be measured by observing the cross section with the use of a microscope.

Method of T3 Measurement

A cross section is exposed by polishing the side surface 12c or side surface 12d of the multilayer ceramic capacitor 10 until the height of the multilayer ceramic capacitor 10 in the width direction W is reduced down to about ½. The thickness t3 of the first external electrode 22a on the line passing through the point of intersection between the tangent line on the corner of the ceramic body 12 and the corner and the point of intersection between the line along the principal surface 12a and the line along the end surface 12e can be measured by observing the cross section with the use of a microscope.

It is to be noted that, although not shown, the first external electrode 22a and the second external electrode 22b, or respective portions of the first external electrode 22a and second external electrode 22b (more specifically, respective portions of the base layer 24a and base layer 24b) may be embedded in the ceramic body 12. In this case, when the thicknesses of central portions of the principal surface portions 23a, 23b of the external electrode 22a on the principal surfaces 12a, 12b are referred to as t0, whereas the maximum thickness of the portion of the external electrode 22a embedded in the ceramic body 12 is referred to as t1, the condition of $(1/10)t0 \le t1 \le (2/5)t0$ is preferably met. Likewise, when the thicknesses of central portions of the principal surface portions 23c, 23d of the external electrode 22b on the principal surfaces 12a, 12b are referred to as t0, whereas the maximum thickness of the portion of the external electrode 22b embedded in the ceramic body 12 is referred to as t1, the condition of about $(1/10)t0 \le t1 \le$ about $(2/5)t0$ is preferably met.

When t1 is less than about $(1/10)t0$, the adhesion between the external electrodes 22a, 22b and the ceramic body 12 may be excessively decreased to make the external electrodes 22a, 22b more likely to be peeled, thus decreasing the reliability of the multilayer ceramic capacitor 10. In addition, when t1 is less than about $(1/10)t0$, the portions of the external electrodes 22a, 22b, which are not embedded, may be excessively increased in height to sufficiently reduce the multilayer ceramic capacitor 10 in height.

On the other hand, when t1 is greater than about $(2/5)t0$, the reliability of the multilayer ceramic capacitor 10 may be decreased. More specifically, there is a possibility that high stress will be applied to the internal electrode 16a or the internal electrode 16b to damage the internal electrode 16a or the internal electrode 16b, when the external electrodes 22a, 22b are embedded in the principal surfaces 12a, 12b of the ceramic body 12. As a result, desired capacitance is unable to be obtained, or short circuit may be caused.

As a method for measuring the embedded amounts (t0 and t1), the side surface 12c, 12d of the multilayer ceramic capacitor 10 can be polished for a cross section along the length direction L down to about ½ the dimension in the width direction W, and the thicknesses of the central portions of the external electrodes 22a, 22b at the points in the cross section can be measured with an optical microscope or the like.

Figure 13A:
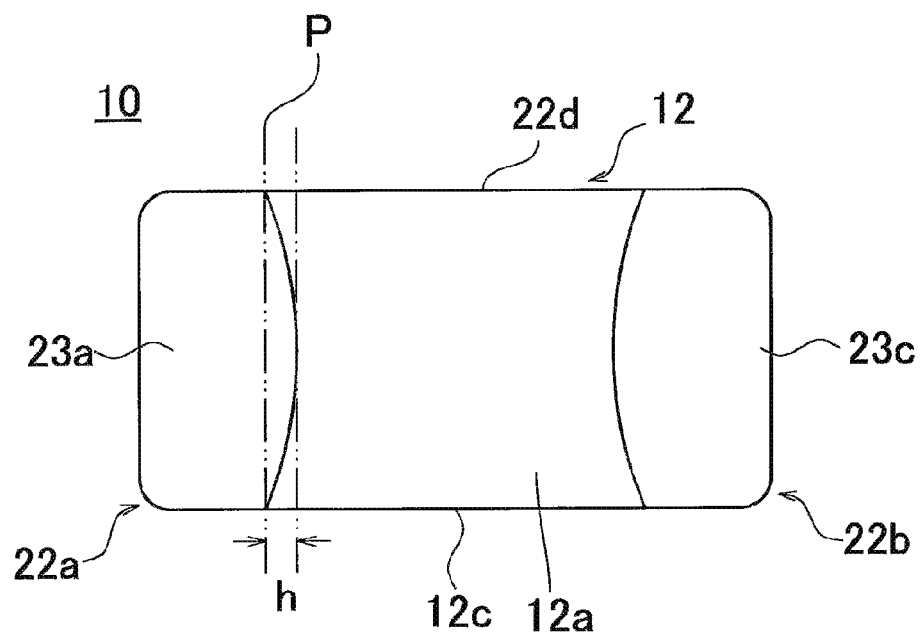
FIGS. 13A and 13B are plan views of multilayer ceramic capacitors, which illustrate the shapes of edge ends of external electrodes provided on principal surfaces of ceramic bodies.
Figure 13B:
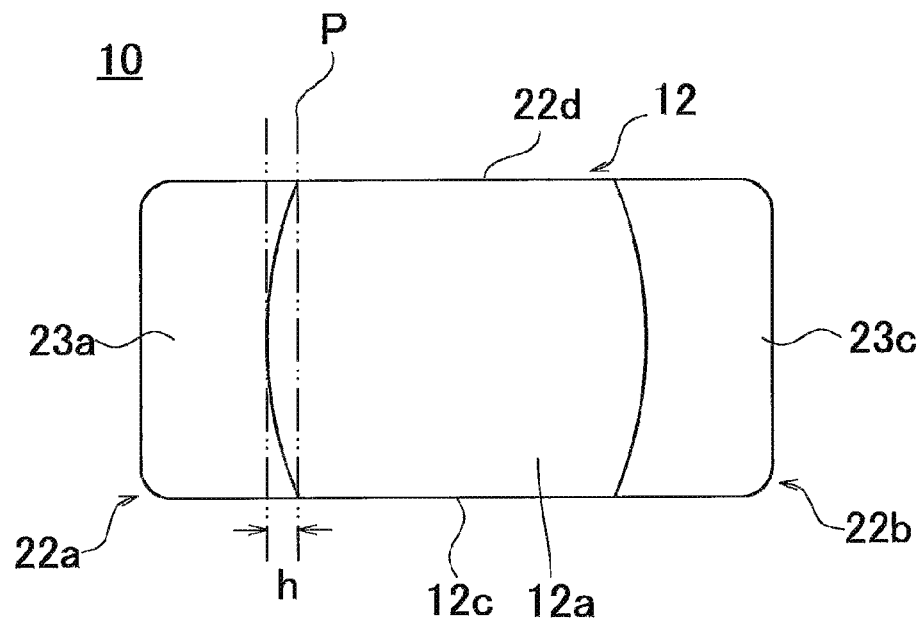

In addition, edge ends of the external electrodes 22a, 22b located on the principal surfaces 12a, 12b of the ceramic body 12 preferably have linear shapes in planar view (that is, preferably not crescent shapes). As shown in FIGS. 13A and 13B, the linear shape refers to, when the line connecting both ends at end edges of the external electrodes 22a, 22b formed on the principal surfaces 12a, 12b is regarded as a reference line P in planar view, a shape where the width h with respect to the reference line P is not more than about ±30 μm away from the positions of the centers in the width direction W (the positions at about ½ dimensions in the width direction W) of the end edges of the external electrodes 22a, 22b. Thus, the external electrodes 22a, 22b are able to be uniformly formed even on both ends of the ceramic body 12 in the width direction W. As a result, even when the laser for irradiation is somewhat shifted in embedding the multilayer ceramic capacitor 10 into a multilayer printed wiring board, it is possible to irradiate the surfaces of the external electrodes 22a, 22b with the laser, and the probability of joint between the via hole and the multilayer ceramic capacitor 10 is increased.

The dimensions of the multilayer ceramic capacitor 10 are preferably about 0.9 mm or more and about 1.1 mm or less in the length direction L, about 0.4 mm or more and about 0.6 mm or less in the width direction W, and about 0.085 mm or more and about 0.15 mm or less in the height direction T.

In the multilayer ceramic capacitor 10, the Cu metal of the Cu plated layers 26a, 26b penetrates in the base layers 24a, 24b to a position of about ⅓ or more of the thicknesses of the base layers 24a, 24b from the surface layers of the base layers 24a, 24b, and the Cu content rate is thus high in the base layers 24a, 24b. Accordingly, in combination with the base layers 24a, 24b and Cu plated layers 26a, 26b in total, the content rate of Cu per unit thickness is increased to improve the thermal conductivity (heat release performance) of the base layers 24a, 24b, and increase the laser resistance of the external electrodes 22a, 22b.

In addition, in the multilayer ceramic capacitor 10, the Cu metal of the Cu plated layers 26a, 26b penetrates in the base layers 24a, 24b to a position of about ⅓ or more of the thicknesses of the base layers 24a, 24b from the surface layers of the base layers 24a, 24b. Thus, the difference in level between the surface of the multilayer printed wiring board and the surfaces of the external electrodes 22a, 22b are reduced because the external electrode 22a (22b) including the base layer 24a (24b) and the Cu plated layer 26a (26b) is reduced in total thickness. As a result, the gap between the surface of the multilayer printed wiring board and the mounting surface 12a (or 12b) of the ceramic body 12 is narrowed to make peeling less likely to be caused between the multilayer printed wiring board and the external electrodes 22a, 22b, and also improve the mechanical strength of the component.

Figure 14:
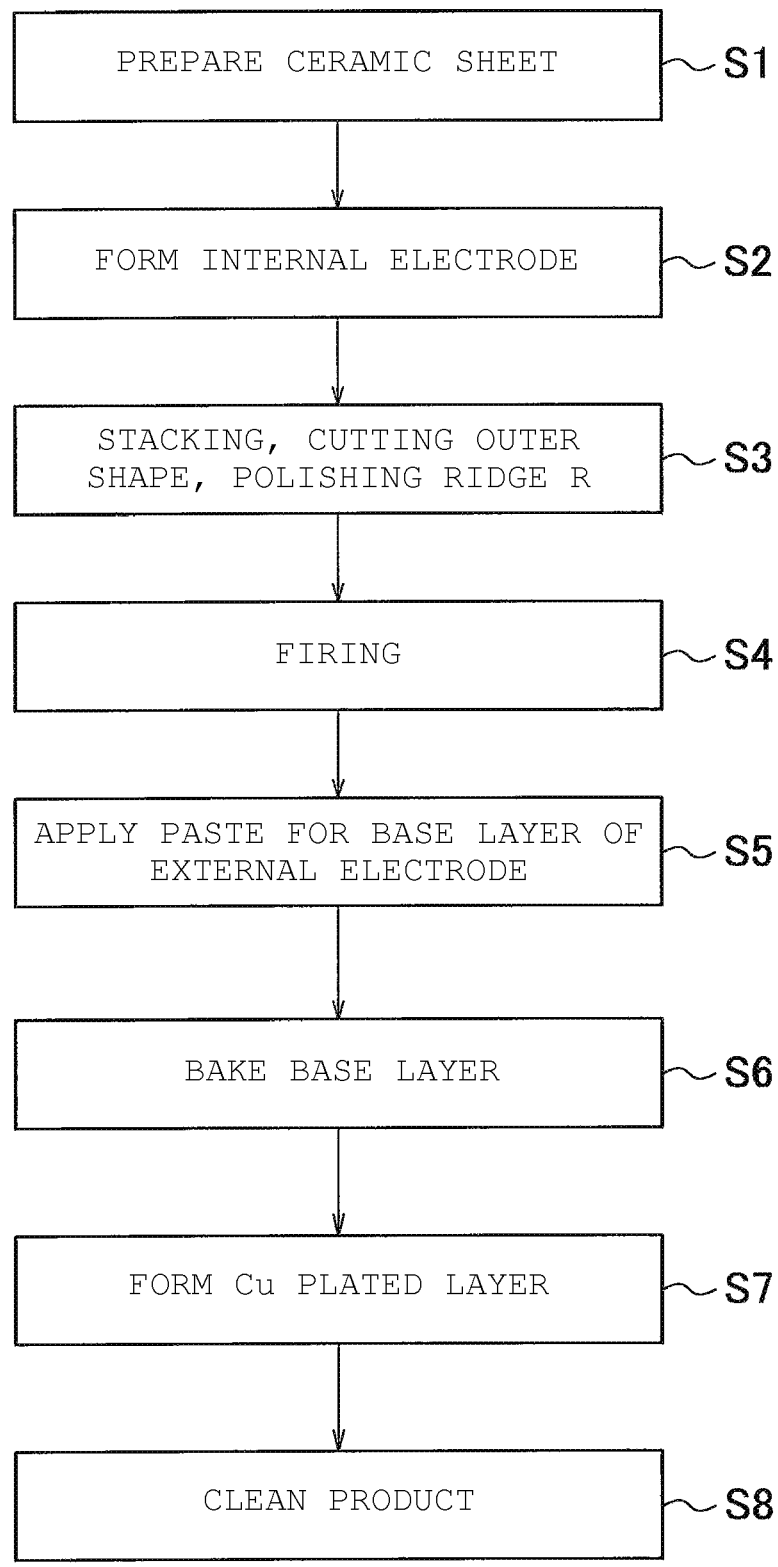
FIG. 14 is a flowchart showing an example of a method for manufacturing the multilayer ceramic capacitor shown in FIG. 1.

Next, a non-limiting example of a method for producing the previously described multilayer ceramic capacitor 10 will be described. FIG. 14 is a flowchart showing a method for manufacturing the multilayer ceramic capacitor 10.

In a step S1, slurry for sheet forming is prepared in such a way that an organic binder, a dispersant, and a plasticizer, etc. are added to a ceramic powder containing a barium titanate material, a strontium titanate material, or the like. Next, the slurry for sheet forming is formed into ceramic green sheets for inner layers or outer layers by a doctor blade method.

Next, in a step S2, an internal electrode paste containing Ag is applied onto the ceramic green sheets for inner layers by a screen printing method, thus forming electrode paste films to define and function as the first internal electrodes 16a and the second internal electrodes 16b.

Next, in a step S3, the plurality of ceramic green sheets for inner layers, which have the electrode paste films formed, are stacked so as to alternate the electrode paste films for the first internal electrodes 16a and the electrode paste films for the second internal electrodes 16b. Furthermore, the plurality of ceramic green sheets for outer layers without any electrode paste films formed for internal electrodes are stacked so as to sandwich the stacked ceramic green sheets for inner layers, and pressed by pressure bonding to prepare a mother laminated body.

In this regard, as for the mold for use in the press, the mold is provided with appropriate surface roughness to obtain the ceramic body 12 with desired arithmetic mean roughness (Ra). It is to be noted that the surface of the ceramic body 12 may be subjected to a physical impact (for example, polishing) or chemical treatment (for example, acid etching), as a method for providing the surface of the ceramic body 12 with desired arithmetic mean roughness (Ra).

Then, this mother laminated body is cut along a virtual cut line on the mother laminated body with a dicing machine or a pushing machine into a size for individual ceramic bodies 12 to provide a plurality of unfired ceramic bodies 12 (raw ceramic laminated bodies).

The unfired ceramic bodies 12 have ridges and corners shaped in R by barrel polishing.

Next, in a step S4, the unfired ceramic bodies 12 are subjected to binder removal treatment, and then firing to provide sintered ceramic bodies 12. The firing temperature can be set appropriately depending on the types of the ceramic material and conductive paste used. The firing temperature can be, for example, about 900° C. or higher and about 1300° C. or lower. The ceramic green sheets for inner layers and outer layers and the electrode paste films are subjected to co-firing to turn the ceramic green sheets for inner layers into the ceramic layers 14 for inner layers, turn the ceramic green sheets for outer layers into the ceramic layers 14 for outer layers, and turn the electrode paste films into the first internal electrodes 16a or the second internal electrodes 16b.

Next, in a step S5, a base paste (a paste containing Cu and glass) for the external electrodes 22a, 22b is applied by a method such as dipping to both ends of the sintered ceramic body 12. The base paste applied to the ceramic body 12 is subjected to hot-air drying for about 10 minutes in the range of about 60° C. or higher and about 180° C. or lower, for example.

Next, in a step S6, the base paste applied to the ceramic body 12 is baked.

Thus, the base layers 24a, 24b of the external electrodes 22a, 22b are formed. The baking temperature is preferably adjusted to, for example, about 780° C. or higher and about 900° C. or lower.

Next, in a step S7, plated layers are formed on the surfaces of the base layers 24a, 24b to form the external electrodes 22a, 22b. Thereafter, if necessary, through immersion in a roughening liquid, the external electrodes 22a, 22b are obtained which have desired arithmetic mean roughness (Ra) at the surfaces of the external electrodes 22a, 22b. It is to be noted that the surfaces of the external electrodes 22a, 22b may be subjected to a physical impact (for example, polishing), as a method for providing the surfaces of the external electrodes 22a, 22b with desired arithmetic mean roughness (Ra). Then, the formation is achieved so that the ratio of the arithmetic mean roughness (Ra) at the surface of the ceramic body/the arithmetic mean roughness at the surface of the external electrode falls within the range of about 0.06 or more and about 0.97 or less.

Next, if necessary, in a step S8, a cleaning process is applied to the multilayer ceramic capacitor 10 in order to obtain the multilayer ceramic capacitor 10 with small impurity amounts (contamination amounts) of K (potassium) and S (sulfur). Pure water or an extremely low concentration of sulfuric acid or hydrochloric acid is used for the cleaning liquid. For cleaning the multilayer ceramic capacitor 10, various methods are selected depending on the size, shape, amount of throughput, etc, for products. For example, the capacitor is stirred in a cleaning tank, or cleaned by a batch process. Alternatively, the capacitor is subjected to shower cleaning with a cleaning liquid while being transferred, or subjected to ultrasonic cleaning. In this way, the multilayer ceramic capacitor 10 is obtained which has small impurity amounts (contamination amounts) of K (potassium) and S (sulfur).

It is to be noted that in the step S5, in the case of applying the base paste by dipping, the position of the maximum thickness of the base paste formed on the principal surfaces 12a, 12b of the ceramic body 12 can be varied by adjusting the rheology of the base paste, carrying out surface treatment of the ceramic body, and applying the base paste twice, if necessary. In this way, the external electrodes 22a, 22b can be formed so that the ratio Ed/e between the dimensions Ed and e for the external electrodes 22a, 22b falls within the range of about $0.243 \leq E/e \leq$ about $0.757$.

In addition, the multilayer ceramic capacitor 10 which is able to achieve a greater effect, as shown in FIG. 7, can be obtained by, in the step S3, for control, changing the stacked number of ceramic green sheets for inner layers or ceramic green sheets for outer layers, and appropriately changing the height A of the effective portion, the height B of the ceramic layer for an outer layer closer to the principal surface 12a, and the height C of the ceramic layer for an outer layer closer to the principal surface 12b.

In addition, the multilayer ceramic capacitor 10 which is able to achieve a greater effect, as shown in FIG. 8, can be obtained by, in the step S5, appropriately controlling the lengths in the length direction L of the portions of the external electrodes located on the principal surfaces in accordance with the following method. More specifically, the lengths in the length direction of the portions of the external electrodes located on the principal surfaces can be controlled by, for example, varying the wettability of the ceramic body to the conductive paste. The wettability of the ceramic body to the base paste can be varied by, for example, applying a surfactant, or carrying out plasma treatment or the like.

Furthermore, the multilayer ceramic capacitor 10 which is able to achieve a greater effect, as shown in FIG. 9, can be obtained in such a way that the distance a in the height direction T between the effective portion Eep where the first internal electrodes 16a and the second internal electrodes 16b are opposed in the height direction T and the principal surface 12a is varied appropriately by increasing or decreasing the stacked number of ceramic green sheets for outer layers in the step S3.

In addition, in the step S2, the distance b in the length direction between the end surface 12e and the effective portion Eep can be controlled in the length direction L by appropriately changing the size of the electrode figure of a printing plate to form the internal electrodes on the ceramic green sheets for inner layers.

Furthermore, the height f of the ceramic body 12 can be arbitrarily varied depending on the combination of the height of the ceramic green sheets for inner layers with the internal electrodes formed or the ceramic green sheets for outer layers, that is, the effective layers, with the ceramic layers 14 for outer layers in the step S3.

Further, for the multilayer ceramic capacitor 10 which is able to achieve a greater effect, as shown in FIG. 9, the thickness c of the portion of the base layer 24a provided over the principal surface 12a is able to be adjusted depending on the combination of the viscosity of the base paste in which the ceramic body 12 is immersed for dipping, the paste thickness in the paste bath, the pull-up rate after the immersion of the ceramic body 12 in the step S5.

In addition, in the step S5, the distance d in the length direction L between the thickest portion of the base layer 24a provided over the end surface 12e and a portion of the base layer 24a located closest to the end surface 12f, which is located over the principal surface 12a is able to be controlled with the viscosity of the base paste in which the ceramic body 12 is immersed for dipping, the paste thickness in the paste bath, and the period of time for which the ceramic body 12 is immersed in the paste.

Furthermore, in the step S5, the thickness e of the portion of the base layer 24a provided over the end surface 12e is able to be adjusted depending on the combination of the viscosity of the base paste in which the ceramic body 12 is immersed for dipping, the paste thickness in the paste bath, the pull-up rate after the immersion of the ceramic body 12. In addition, depending on the condition for the pull-up, it is possible to change the magnitude relationship with the thickness of the portion of the base layer 24a provided over the principal surface 12a.

In addition, the multilayer ceramic capacitor 10 which is able to achieve a greater effect, as shown in FIG. 10, can be obtained in such a way that a ceramic green sheet for an outer layer, ceramic green sheets for inner layers with electrode paste films formed in shapes corresponding to the first internal electrodes 16a or the second internal electrodes 16b, and a plurality of ceramic green sheets for outer layers are stacked in this order, and pressed in the stacking direction to prepare a mother laminated body in the step S3.

Specifically, the mother laminated body is pressed with the use of a first pressing tool that has a plate-shaped pressing surface and a second pressing tool that has a pressing surface with a plurality of recesses and protrusions. Thereafter, the mother laminated body is further pressed with the use of a pair of pressing tools that have plate-shaped pressing surfaces. In this way, the mother laminated body can be prepared which has electrode paste films including a plurality of recesses and protrusions.

In addition, the multilayer ceramic capacitor 10 which is able to achieve a greater effect, as shown in FIG. 11, can be obtained by appropriately controlling the type of the glass and the amount of the glass in the base paste which forms the base layers, with regard to the composition of the reactive layers. In addition, the reactive layers can be controlled, as for the thicknesses thereof, by appropriately changing the baking temperature for the base layers in the step S6.

Specifically, the base paste for use in the formation of the base layers includes a metal powder and $SiO_2$—$B_2O_3$-based glass frit, and the glass frit preferably contains $SiO_2$: about 10 weight % to about 50 weight %, $B_2O_3$: about 10 weight % to about 30 weight %, and $V_2O_5$: about 1 weight % to about 10 weight % in terms of oxide. The glass frit is preferably contained at about 0.5 weight % to about 10 weight % with respect to 100 weight % of the metal powder.

In addition, the baking temperature for the base layers is preferably about 730° C. to about 850° C.

In addition, the multilayer ceramic capacitor 10 which is able to achieve a greater effect, as shown in FIG. 12, can be obtained in such a way that t1 to t3 are varied by appropriately controlling, for example, the viscosity of the base paste for forming the base layers 24a, 24b, the rate of immersing the ceramic body 12 in the base paste, the rate of pulling up the body, the condition for drying the base paste, etc., in the step S5.

In this way, the desired multilayer ceramic capacitor 10 is obtained.

EXPERIMENTAL EXAMPLES

1. Preparation of Evaluation Sample

In the experimental examples, in order to evaluate the external electrodes 22a, 22b for laser resistance and moisture resistance, evaluation samples of the multilayer ceramic capacitor 10 according to Examples 1 to 3 and Comparative Examples 1 to 6 were prepared by controlling the Cu metal of the plated layers 26a, 26b respectively to penetrate into the base layers 24a, 24b, without control for achieving desired arithmetic mean roughness (Ra) of the ceramic body 12 in the step S3 of the manufacturing method mentioned in the previously described preferred embodiment, control for achieving desired arithmetic mean roughness (Ra) of the external electrodes 22a, 22b in the step S7 thereof, and controlling for reducing the impurities in the step S8. The plated layers 26a, 26b are entirely composed of Cu plating. In the formation of the Cu plated layers 26a, 26b, a pyrophosphoric acid Cu plating solution at pH 8.0 was used in the case of Examples 1 to 3. On the other hand, a pyrophosphoric acid Cu plating solution at pH 7.0 was used in the case of Comparative Examples 1 to 6. Glass containing BaO in an amount of about 10 weight % or more and about 50 weight % or less, SrO in an amount of about 10 weight % or more and about 50 weight % or less, $B_2O_3$ in an amount of about 3 weight % or more and about 30 weight % or less, and $SiO_2$ in an amount of about 3 weight % or more and about 30 weight % or less was used for the glass in the base layers 24a, 24b.

Furthermore, the thicknesses of the base layers 24a, 24b and Cu plated layers 26a, 26b were controlled by controlling the plating time, etc, in the plating process, so as to have the numerical values listed in Tables 1 and 2.

The dimensions of the multilayer ceramic capacitor 10 are about 1.0 mm in dimension in the length direction L, about 0.5 mm in dimension in the width direction W, and about 0.15 mm in dimension in the height direction T.

2. Confirmation of Penetration of Cu Metal of Cu Plated Layer into Base Layer

As shown in FIG. 4, in order to confirm whether the Cu metal of the Cu plated layers 26a, 26b penetrates into the base layers 24a, 24b or not, the side surface (surface LT) of the multilayer ceramic capacitor 10 was polished along the length direction L until reaching about ½ the dimension in the width direction W, and the polished surface was observed with an optical microscope. Specifically, with regard to the principal surface portion 23a (base layer 24a+Cu plated layer 26a) of the external electrode 22a provided on the first principal surface 12a of the ceramic body 12 in the polished cross section, the sample was regarded as "Yes" when the Cu metal of the Cu plated layer 26a penetrated in the base layer 24a to a position of about ⅓ or more of the thickness of the base layer 24a from the surface layer of the base layer 24a, or regarded as "No" when the Cu metal failed to penetrate therein to a position of about ⅓ or more of the thickness of the base layer 24a from the surface layer.

3. Method for Measurement of Physical Thickness of Base Layer and Cu Plated Layer In order to measure the physical thicknesses of the base layers 24a, 24b and Cu plated layers 26a, 26b, the side surface (surface LT) of the multilayer ceramic capacitor 10 was polished along the length direction L until reaching about ½ the dimension in the width direction W, and the polished surface was observed visually and measured with an optical microscope. Specifically, the thickness was measured in a position of about ½ the length of the principal surface portion 23a (base layer 24a+Cu plated layer 26a) of the first external electrode 22a provided on the first principal surface 12a of the ceramic body in the polished cross section. Likewise, the thickness was measured in a position of about ½ the length of the principal surface portion 23c (base layer 24b+Cu plated layer 26b) of the second external electrode 22b provided on the first principal surface 12a of the ceramic body 12 in the polished cross section. Then, the average of both the measurement values was regarded as the physical thicknesses of the base layers 24a, 24b and Cu plated layers 26a, 26b. The measurement values each refer to an average value for 50 evaluation samples.

4. Method for Measurement of Metal Thickness of Base Layer and Cu Plated Layer

In order to measure the metal thicknesses of the base layers 24a, 24b and Cu plated layers 26a, 26b, a fluorescent X-ray film thickness meter (SFT-9400 from Seiko Instruments Inc.) was used for the measurement. In regard to measurement point, the thickness was measured, for example, in a position of a central portion of the principal surface portion 23a (base layer 24a+Cu plated layer 26a) of the external electrode 22a. The collimator diameter was about 50 μmφ. The measurement time was adjusted to about 1 minute. The data refers to an average value for 50 evaluation samples.

5. Method for Evaluation of Laser Resistance

In order to carry out a laser resistance test, a $CO_2$ laser system (ML605GTX from Mitsubishi Electric Corporation) was used. For example, central portion in each of the length direction L and width direction W of the principal surface portion 23a (base layer 24a+Cu plated layer 26a) of the first external electrode 22a provided on the first principal surface 12a of the ceramic body 12 was first irradiated with a single shot of $CO_2$ laser under the condition of pulse width: about 2 μs, frequency: about 4000 Hz, and energy density: about 30 mJ. Next, the pulse width of the $CO_2$ laser for the irradiation was increased in stages by about 2 μs up to about 16 μs. As a result, the sample was regarded as NG when a molten mark was generated at the surface of the principal surface portion 23a of the first external electrode 22a, or when a broken mark was generated at the first principal surface 12a of the ceramic body 12.

6. Moisture Resistance Load Test Method

In order to carry out a moisture resistance load test, the multilayer ceramic capacitor 10 as an evaluation sample was embedded into a multilayer printed wiring board, and then left for about 400 hours in an air atmosphere at a temperature of about 120° C. and a humidity of about 100% RH under application of a voltage of about 6.3 V. Then, the insulation resistance IR was measured, and when the insulation resistance IR met the condition expression of Log (IR)<5, the sample was regarded as a failure.

7. Evaluation Result of External Electrode

Table 1 shows evaluation results. In addition, Table 2 is a table that shows details of the total physical thickness and total metal thickness of base layer+Cu plated layer shown in Table 1, and shows the individual physical thickness and metal thickness of the base layer 24a, 24b and Cu plated layer 26a, 26b.

TABLE 1

| | Comparative Example 1 | Example 1 | Comparative Example 2 | Example 2 | Comparative Example 3 | Example 3 | Comparative Example 4 | Comparative Example 5 | Comparative Example 6 |
|---|---|---|---|---|---|---|---|---|---|
| Penetration of Cu Metal into Base layer | Yes | Yes | No | Yes | No | Yes | No | Yes | No |
| Total Physical Thickness of Base layer + Cu Plated Layer (μm) | 7.0 | 10.4 | 11.9 | 15.7 | 15.5 | 20.2 | 18.9 | 24.3 | 24.7 |
| Total Metal Thickness of Base layer + Cu Plated Layer (μm) | 6.5 | 8.7 | 8.6 | 11.5 | 9.5 | 13.9 | 11.0 | 16.4 | 14.0 |
| NG Number in Laser Resistance Test | 4/50 | 0/50 | 7/50 | 0/50 | 5/50 | 0/50 | 2/50 | 0/50 | 0/50 |
| NG Number in Moisture Resistance Load Test | 0/20 | 0/20 | 0/20 | 0/20 | 0/20 | 0/20 | 0/20 | 2/20 | 3/20 |
| NG Percentage in Laser Resistance Test (%) | 8 | 0 | 14 | 0 | 10 | 0 | 4 | 0 | 0 |
| NG Percentage in Moisture Resistance Load Test (%) | 0 | 0 | 0 | 0 | 0 | 0 | 0 | 10 | 15 |
| Comprehensive Evaluation | NG | OK | NG | OK | NG | OK | NG | NG | NG |

TABLE 2

| | Comparative Example 1 | Example 1 | Comparative Example 2 | Example 2 | Comparative Example 3 | Example 3 | Comparative Example 4 | Comparative Example 5 | Comparative Example 6 |
|---|---|---|---|---|---|---|---|---|---|
| Physical Thickness of Base layer (μm) | 1.0 | 3.4 | 4.9 | 8.5 | 9.0 | 12.7 | 11.9 | 15.8 | 16.0 |
| Physical Thickness of Cu Plated Layer (μm) | 6.0 | 7.0 | 7.0 | 7.2 | 6.5 | 7.5 | 7.0 | 8.5 | 8.7 |
| Metal Thickness of Base layer (μm) | 0.5 | 1.7 | 1.6 | 4.3 | 3.0 | 6.4 | 4.0 | 7.9 | 5.3 |
| Metal Thickness of Cu Plated Layer (μm) | 6.0 | 7.0 | 7.0 | 7.2 | 6.5 | 7.5 | 7.0 | 8.5 | 8.7 |

From Table 1, in the case of Examples 1 to 3 (when the Cu metal of the Cu plated layers 26a, 26b of the external electrodes 22a, 22b penetrated in the base layers 24a, 24b to a position of about ⅓ or more of the thicknesses of the base layers 24a, 24b, and when the metal thicknesses of the external electrodes 22a, 22b were about 8.7 μm or more and about 13.9 μm or less), the NG percentage in the laser resistance test and the NG percentage in the moisture resistance load test were both 0%. Accordingly, the comprehensive evaluations were regarded as "OK".

On the other hand, in the case of Comparative Example 1 (when the Cu metal of the Cu plated layers 26a, 26b of the external electrodes 22a, 22b penetrated in the base layers 24a, 24b to a position of about ⅓ or more of the thicknesses of the base layers 24a, 24b from the surface layers of the base layers 24a, 24b, while the external electrodes 22a, 22b were thin with a metal thickness of about 6.5 μm), the NG percentage in the laser resistance test was about 8%. Accordingly, the comprehensive evaluation was regarded as "NG".

In the case of Comparative Examples 2 to 4 (when the Cu metal of the Cu plated layers 26a, 26b of the external electrodes 22a, 22b failed to penetrate in the base layers 24a, 24b to a position of about ⅓ or more of the thicknesses of the base layers 24a, 24b from the surface layers of the base layers 24a, 24b), the NG percentage in the laser resistance test was about 4% to about 14%. Accordingly, the comprehensive evaluations were regarded as "NG".

In the case of Comparative Examples 5 and 6 (when the Cu metal of the Cu plated layers 26a, 26b of the external electrodes 22a, 22b penetrated in the base layers 24a, 24b to a position of about ⅓ or more of the thicknesses of the base layers 24a, 24b from the surface layers of the base layers 24a, 24b, while the metal thicknesses of the external electrodes 22a, 22b were greater than about 13.9 μm), the NG percentage in the moisture resistance load test was about 10% to about 15%. Accordingly, the comprehensive evaluations were regarded as "NG".

In the preferred embodiments and experimental examples mentioned above, the side surfaces of the ceramic bodies also preferably include external electrodes provided thereon, but there is no need to provide the external electrodes on the side surfaces of the ceramic bodies.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic capacitor comprising:
a ceramic body including a plurality of ceramic layers and first and second internal electrodes stacked, the ceramic body including first and second principal surfaces opposed to each other in a height direction, side surfaces opposed to each other in a width direction, and end surfaces opposed to each other in a length direction; and
an external electrode including a base layer including metal and glass and a plated layer provided over a surface of the base layer, the external electrode provided over one of the end surfaces and a portion of the first principal surface of the ceramic body, and connected to one of the first and second internal electrodes at the one of the end surfaces; wherein
the plated layer includes a Cu plated layer including an outermost surface of the external electrode; and
Cu plated materials are present in the base layer to a position of about ⅓ or more of a thickness of the base layer from a surface layer of the external electrode; and
the external electrode is about 8.7 μm or more and about 13.9 μm or less in metal thickness on average.

2. The multilayer ceramic capacitor according to claim 1, wherein the multilayer ceramic capacitor is about 0.9 mm or more and about 1.1 mm or less in length dimension, about 0.4 mm or more and about 0.6 mm or less in width dimension, and about 0.085 mm or more and about 0.15 mm or less in height dimension.

3. The multilayer ceramic capacitor according claim 1, wherein the Cu plated layer is made through use of one of a pyrophosphoric acid Cu plating solution and a cyanide Cu plating solution.

4. The multilayer ceramic capacitor according to claim 1, wherein the glass contained in the base layer contains BaO in an amount of about 10 weight % or more and about 50 weight % or less, SrO in an amount of about 10 weight % or more and about 50 weight % or less, $B_2O_3$ in an amount of about 3 weight % or more and about 30 weight % or less, and $SiO_2$ in an amount of about 3weight % or more and about 30 weight % or less, and a total weight of BaO, SrO, $B_2O_3$ and $SiO_2$ is 100 weight %.

5. The multilayer ceramic capacitor according to claim 1, wherein
a thickness of an effective portion that is a portion of the ceramic body where the first and second internal electrodes are provided is referred to as A in the thickness direction;
a thickness of a first outer layer portion that is a portion of the ceramic body located closer to the first principal surface than the effective portion is referred to as B in the thickness direction;
a thickness of a second outer layer portion that is a portion of the ceramic body located closer to the second principal surface than the effective portion is referred to as C in the thickness direction; and
each of ratios A/B and A/C fall within a range of about 0.5 to about 16.

6. The multilayer ceramic capacitor according to claim 1, wherein
- from one of the first and second internal electrodes located closest to a first principal surface side of the ceramic body, a maximum value of a distance to the first principal surface of the ceramic body in the thickness direction is $T_{MAX}$; and
- from the one of the first and second internal electrodes located closest to the first principal surface side of the ceramic body, a minimum value of a distance to the first principal surface of the ceramic body in the thickness direction is $T_{MIN}$;
- the one of the first and second internal electrodes located closest to the first principal surface is configured such that the multilayer ceramic capacitor is about 0.9 mm or more and about 1.1 mm or less in length dimension, the multilayer ceramic capacitor is about 0.4 mm or more and about 0.6 mm or less in width dimension, the multilayer ceramic capacitor is about 0.085 mm or more and about 0.11 mm or less in thickness dimension; and
- a ratio $(T_{MAX}-T_{MIN})/T$ is about 1.0% to about 5.0%.

7. The multilayer ceramic capacitor according to claim 1, wherein
- from one of the first and second internal electrodes located closest to a first principal surface side of the ceramic body, a maximum value of a distance to the first principal surface of the ceramic body in the thickness direction is $T_{MAX}$; and
- from the one of the first and second internal electrodes located closest to the first principal surface side of the ceramic body, a minimum value of a distance to the first principal surface of the ceramic body in the thickness direction is $T_{MiN}$;
- the one of the first and second internal electrodes located closest to the first principal surface is configured such that the multilayer ceramic capacitor is about 0.9 mm or more and about 1.1 mm or less in length dimension, the multilayer ceramic capacitor is about 0.4 mm or more and about 0.6 mm or less in width dimension, the multilayer ceramic capacitor is about 0.012 mm or more and about 0.15 mm or less in thickness dimension; and
- a ratio $(T_{MAX}-T_{MIN})/T$ is about 1.3% to about 5.3%.

8. The multilayer ceramic capacitor according to claim 1, wherein
- from one of the first and second internal electrodes located closest to a first principal surface side of the ceramic body, a maximum value of a distance to the first principal surface of the ceramic body in the thickness direction is $T_{MAX}$; and
- from the one of the first and second internal electrodes located closest to the first principal surface side of the ceramic body, a minimum value of a distance to the first principal surface of the ceramic body in the thickness direction is $T_{MIN}$;
- the one of the first and second internal electrodes located closest to the first principal surface is configured such that the multilayer ceramic capacitor is about 0.9 mm or more and about 1.1 mm or less in length dimension, the multilayer ceramic capacitor is about 0.4 mm or more and about 0.6 mm or less in width dimension, the multilayer ceramic capacitor is about 0.018 mm or more and about 0.20 mm or less in thickness dimension, and
- a ratio $(T_{MAX}-T_{MIN})/T$ is about 1.5% to about 5.0%.

9. The multilayer ceramic capacitor according to claim 1, wherein
- from one of the first and second internal electrodes located closest to a first principal surface side of the ceramic body, a maximum value of a distance to the first principal surface of the ceramic body in the thickness direction is $T_{MAX}$; and
- from the one of the first and second internal electrodes located closest to the first principal surface side of the ceramic body, a minimum value of a distance to the first principal surface of the ceramic body in the thickness direction is $T_{MIN}$;
- the one of the first and second internal electrodes located closest to the first principal surface is configured such that the multilayer ceramic capacitor is about 0.9 mm or more and about 1.1 mm or less in length dimension, the multilayer ceramic capacitor is about 0.4 mm or more and about 0.6 mm or less in width dimension, the multilayer ceramic capacitor is about 0.021 mm or more and about 0.23 mm or less in thickness dimension; and
- a ratio $(T_{MAX}-T_{MIN})/T$ is about 1.8% to about 5.9%.

10. The multilayer ceramic capacitor according to claim 1, wherein
- from one of the first and second internal electrodes located closest to a first principal surface side of the ceramic body, a maximum value of a distance to the first principal surface of the ceramic body in the thickness direction is $T_{MAX}$; and
- from the one of the first and second internal electrodes located closest to the first principal surface side of the ceramic body, a minimum value of a distance to the first principal surface of the ceramic body in the thickness direction is $T_{MIN}$;
- the one of the first and second internal electrodes located closest to the first principal surface is configured such that the multilayer ceramic capacitor is about 0.9 mm or more and about 1.1 mm or less in length dimension, the multilayer ceramic capacitor is about 0.4 mm or more and about 0.6 mm or less in width dimension, the multilayer ceramic capacitor is about 0.024 mm or more and about 0.30 mm or less in thickness dimension, and
- a ratio $(T_{MAX}-T_{MIN})/T$ is about 1.2% to about 6.0%.

11. The multilayer ceramic capacitor according to claim 1, wherein
- a maximum thickness of a portion of the external electrode located on the one of the end surfaces is t1 in a cross section passing through a center in the width direction and extending in the length direction and the thickness direction;
- a maximum thickness of a portion of the external electrode located on the first principal surface is t2 in a cross section passing through the center in the width direction and extending in the length direction and the thickness direction; and
- a thickness of the external electrode on a line passing through a point of intersection between a tangent line on a corner of the ceramic body, and the corner and the point of intersection between a line along the first principal surface and a line along the one of the end surfaces is t3 in a cross section passing through the center in the width direction and extending in the length direction and the thickness direction;
- in the multilayer ceramic capacitor, a ratio t2/t1 is about 0.7 to about 1.0, and a ratio t3/t1 is about 0.4 to about 1.2.

12. The multilayer ceramic capacitor according to claim 1, wherein
the external electrode of the multilayer ceramic capacitor is configured such that when a distance from a position of a maximum thickness on the first principal surface of the ceramic body to a position of a maximum thickness on the one of the end surfaces of the ceramic body is a dimension Ed; and
a distance from a position of a maximum thickness on the one of the end surfaces of the ceramic body to an edge end of the external electrode on the first principal surface of the ceramic body is referred to as a dimension e; and
a ratio Ed/e is about 0.243 or more and about 0.757 or less.

13. The multilayer ceramic capacitor according to claim 1, wherein a maximum thickness and an average thickness of a portion of the external electrode located on the principal surfaces of the ceramic body are denoted respectively by $D_{max}$ and $D_{ave}$; and
$D_{ave} \times 250\% \geq D_{max} \geq D_{ave} \times 120\%$ is satisfied.

14. The multilayer ceramic capacitor according to claim 1, wherein each of the plurality of ceramic layers is about 0.5 μm or more and about 10 μm or less in height.

15. The multilayer ceramic capacitor according to claim 1, wherein each of the first internal electrode and the second internal electrode is about 0.2 μm to about 2 μm in height.

16. The multilayer ceramic capacitor according to claim 1, wherein the base layer is about 1 μm to about 20 μm in thickness.

17. The multilayer ceramic capacitor according to claim 1, wherein the Cu plated layer is about 1 μm to about 10 μm in thickness.

18. The multilayer ceramic capacitor according to claim 1, wherein the Cu plated layer includes a plurality of plated films.

19. An electronic component comprising:
a multilayer printed wiring board; and
the multilayer ceramic capacitor according to claim 1 embedded in the multilayer printed wiring board.

20. The electronic component according to claim 19, wherein a via hole is provided in the multilayer printed wiring board to provide electrical connection to the multilayer ceramic capacitor.

* * * * *